(12) United States Patent
Choi et al.

(10) Patent No.: US 9,812,559 B2
(45) Date of Patent: Nov. 7, 2017

(54) FINFET SEMICONDUCTOR DEVICES AND METHOD OF FORMING THE SAME

(71) Applicant: Samsung Electronics Co., Ltd., Suwon-si, Gyeonggi-do (KR)

(72) Inventors: Kyung-In Choi, Seoul (KR); Bong-Soo Kim, Hwaseong-si (KR); Hyun-Seung Kim, Bucheon-si (KR); Hyun-Gi Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/236,726

(22) Filed: Aug. 15, 2016

(65) Prior Publication Data

US 2017/0069737 A1    Mar. 9, 2017

(30) Foreign Application Priority Data

Sep. 3, 2015 (KR) .......................... 10-2015-0124728

(51) Int. Cl.

| | |
|---|---|
| *H01L 29/66* | (2006.01) |
| *H01L 21/225* | (2006.01) |
| *H01L 29/08* | (2006.01) |
| *H01L 21/02* | (2006.01) |
| *H01L 29/78* | (2006.01) |

(52) U.S. Cl.
CPC .. *H01L 29/66803* (2013.01); *H01L 21/02175* (2013.01); *H01L 21/02244* (2013.01); *H01L 21/02252* (2013.01); *H01L 21/2255* (2013.01); *H01L 21/2256* (2013.01); *H01L 29/0847* (2013.01); *H01L 29/66492* (2013.01);

(Continued)

(58) Field of Classification Search
CPC ......... H01L 29/66803; H01L 29/66795; H01L 29/6681; H01L 29/66818; H01L 29/66545; H01L 21/2256; H01L 21/2255; H01L 21/2254; H01L 21/02252; H01L 21/02175; H01L 21/02244; H01L 29/785; H01L 29/7851; H01L 29/66492; H01L 29/0847

See application file for complete search history.

(56) References Cited

U.S. PATENT DOCUMENTS

| | | | |
|---|---|---|---|
| 8,105,926 | B2 | 1/2012 | Sasaki et al. |
| 8,124,507 | B2 | 2/2012 | Sasaki et al. |

(Continued)

FOREIGN PATENT DOCUMENTS

| | | |
|---|---|---|
| CN | 104637820 A | 5/2015 |
| KR | 10-0668860 | 1/2007 |

(Continued)

*Primary Examiner* — Michael Trinh
(74) *Attorney, Agent, or Firm* — Myers Bigel, P.A.

(57) ABSTRACT

Provided are a semiconductor device and a method of fabricating the same. The method comprises forming an active fin extending along a first direction; forming a field insulating layer exposing an upper part of the active fin, along long sides of the active fin; forming a dummy gate pattern extending along a second direction intersecting the first direction, on the active fin; forming a spacer on at least one side of the dummy gate pattern; forming a liner layer covering the active fin exposed by the spacer and the dummy gate pattern; forming a dopant supply layer containing a dopant element, on the liner layer; and forming a doped region in the active fin along an upper surface of the active fin by heat-treating the dopant supply layer.

19 Claims, 39 Drawing Sheets

(52) U.S. Cl.
CPC ...... *H01L 29/66545* (2013.01); *H01L 29/785* (2013.01); *H01L 29/7851* (2013.01)

(56) References Cited

U.S. PATENT DOCUMENTS

| | | | |
|---|---|---|---|
| 8,187,928 | B2 | 5/2012 | Yu et al. |
| 8,298,925 | B2 | 10/2012 | Wu et al. |
| 8,324,685 | B2 | 12/2012 | Okumura et al. |
| 8,394,710 | B2 * | 3/2013 | Cheng .................... B82Y 10/00 257/E21.144 |
| 8,409,939 | B2 | 4/2013 | Sasaki et al. |
| 8,574,972 | B2 | 11/2013 | Sasaki et al. |
| 8,946,829 | B2 | 2/2015 | Wann et al. |
| 8,980,719 | B2 * | 3/2015 | Tsai .................... H01L 21/2254 257/E21.144 |
| 9,006,065 | B2 | 4/2015 | Yen et al. |
| 2014/0217483 | A1 * | 8/2014 | Choi .................... H01L 29/785 257/288 |
| 2015/0021712 | A1 * | 1/2015 | Zschaetzsch ....... H01L 21/2254 257/402 |
| 2015/0132909 | A1 | 5/2015 | Choi et al. |
| 2016/0190137 | A1 * | 6/2016 | Tsai .................... H01L 27/0924 257/369 |

FOREIGN PATENT DOCUMENTS

| | | |
|---|---|---|
| KR | 10-2007-0024965 | 3/2007 |
| KR | 10-2007-0062867 | 6/2007 |
| KR | 10-0799101 | 1/2008 |

* cited by examiner

FINFET SEMICONDUCTOR DEVICES AND METHOD OF FORMING THE SAME

REFERENCE TO PRIORITY APPLICATION

This application claims priority from Korean Patent Application No. 10-2015-0124728 filed on Sep. 3, 2015 in the Korean Intellectual Property Office, the disclosure of which is incorporated herein by reference in its entirety.

BACKGROUND

The present invention relates to semiconductor devices and methods of fabricating the same.

As one of the scaling techniques for increasing the density of a semiconductor device, a multi-gate transistor has been suggested. The multi-gate transistor is obtained by forming a fin-shaped silicon body on a substrate and forming a gate on the surface of the silicon body. The multi-gate transistor can be easily scaled because it uses a three-dimensional (3D) channel. In addition, the current control capability can be improved without the need to increase the gate length of the multi-gate transistor. Moreover, it is possible to effectively suppress parasitic short channel effects (SCE) in which an electric potential of a channel region is affected by a drain voltage.

SUMMARY

Aspects of the present inventive concept provide a semiconductor device which can secure short channel characteristics in response to a reduction in gate length and ensure high current driving characteristics by reducing parasitic resistance.

Aspects of the present inventive concept also provide a method of fabricating the semiconductor device.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

A FinFET includes a fin-shaped semiconductor active/channel region having an insulated gate electrode thereon. Source and drain regions of first conductivity type are provided, which extend adjacent source-side and drain-side ends of the fin-shaped semiconductor active region, respectively. A first doped semiconductor region of second conductivity type is also provided, which extends between at least a portion of the source region and the source-side end of the fin-shaped semiconductor active region. This first doped semiconductor region may be configured to form a first P-N rectifying junction with the source region and a semiconductor junction with the source-side end of the fin-shaped semiconductor active region. A second doped semiconductor region of second conductivity type may also be provided, which extends between at least a portion of the drain region and the drain-side end of the fin-shaped semiconductor active region. This second doped semiconductor region may be configured to form a second P-N rectifying junction with the drain region and a semiconductor junction with the drain-side end of the fin-shaped semiconductor active region.

In some of these embodiments of the invention, the first doped semiconductor region is configured so that at least a majority of all charge carriers (i.e., electrons/holes) passing between the source region and the fin-shaped semiconductor active region during forward on-state conduction within the FinFET also pass through the first doped semiconductor region. In particular, the first doped semiconductor region may be configured so that all charge carriers passing between the source region and the fin-shaped semiconductor active region during forward on-state conduction within the FinFET also pass through the first P-N rectifying junction.

In still other embodiments of the invention, the first doped semiconductor region may have an L-shape when viewed in a direction parallel to a lengthwise direction of the insulated gate electrode. The insulated gate electrode may also include an electrically conductive gate and a sidewall spacer, which extends on a sidewall of the electrically conductive gate and directly on the first doped semiconductor region, which extends to a top surface of the fin-shaped semiconductor active region.

According to still further embodiments of the invention, a CMOS integrated circuit is provided, which includes an aligned combination of an N-type FinFET and a P-type FinFET. The N-type FinFET includes a first fin-shaped semiconductor active region having a first insulated gate electrode thereon and first source and drain regions of first conductivity type extending adjacent source-side and drain-side ends of the first fin-shaped semiconductor active region, respectively. A first doped semiconductor region of second conductivity type is provided, which extends between at least a portion of the first source region and the source-side end of the first fin-shaped semiconductor active region. The P-type FinFET includes a second fin-shaped semiconductor active region, which is aligned to be collinear with the first fin-shaped semiconductor active region and has a second insulated gate electrode thereon. Second source and drain regions of second conductivity type are provided, which extend adjacent source-side and drain-side ends of the second fin-shaped semiconductor active region, respectively. A second doped semiconductor region of first conductivity type is provided, which extends between at least a portion of the second source region and the source-side end of the second fin-shaped semiconductor active region.

According to some of these embodiments of the invention, the first and second doped semiconductor regions within the CMOS integrated circuit have unequal thicknesses. For example, the first doped semiconductor region of the N-type FinFET may be thicker than the second doped semiconductor region of the P-type FinFET. In addition, in some embodiments, the first doped semiconductor region may be doped with boron (B) and the second doped semiconductor region may be doped with arsenic (As). In additional embodiments of the invention, the first doped semiconductor region has an L-shape when viewed in a direction parallel to a lengthwise direction of the first insulated gate electrode and the second doped semiconductor region has an L-shape when viewed in a direction parallel to a lengthwise direction of the second insulated gate electrode.

According to another aspect of the present inventive concept, there is provided a semiconductor device comprising an active fin including, along an upper surface thereof, a doped region extending along a first direction and containing a first dopant and an undoped region not containing the first dopant which also extends along the first direction. A source/drain region is provided on the doped region, and contacts the doped region, and contains a second dopant. A gate pattern is provided on the undoped region and extends along a second direction intersecting the first direction. A spacer is provided at least one side of the gate pattern, wherein an interface between the doped region and the undoped region is disposed below the spacer.

In some embodiments of the inventive concept, the doped region and the undoped region are disposed successively along the upper surface of the active fin.

In some embodiments of the inventive concept, the interface contacts the lower surface of the spacer.

In some embodiments of the inventive concept, the active fin has the upper surface and both side surfaces which face each other, and the doped region is formed to a uniform depth in the active fin along the upper surface of the active fin and both side surfaces of the active fin which face each other.

In some embodiments of the inventive concept, the doped region contains arsenic or boron.

In some embodiments of the inventive concept, the concentration of the first dopant is lower than that of the second dopant.

According to another aspect of the present inventive concept, there is provided a semiconductor device comprising: a substrate including a first area and a second area; a first transistor in the first area; and a second transistor in the second area, wherein the first transistor comprises a first doped region, a first active pattern which extends along a first direction, a first gate pattern which is formed on the first active pattern and extends along a second direction intersecting the first direction, a first spacer which is disposed on at least one side of the first gate pattern and a first source/drain region which is formed on the first doped region, and the second transistor comprises a second doped region, a second active pattern which extends along a third direction, a second gate pattern which is formed on the second active pattern and extends along a fourth direction intersecting the third direction, a second spacer which is disposed on at least one side of the second gate pattern and a second source/drain region which is formed on the second doped region, wherein the first doped region is formed to a first width in the first active pattern along an upper surface of the first active pattern, and the second doped region is formed to a second width different from the first width in the second active pattern along an upper surface of the second active pattern.

In some embodiments of the inventive concept, the first transistor is a P-type transistor which comprises arsenic in the first doped region, and the second transistor is an N-type transistor which comprises boron in the second doped region.

In some embodiments of the inventive concept, the first width is smaller than the second width.

In some embodiments of the inventive concept, the first doped region is formed to a uniform width in the first active pattern along the upper surface of the first active pattern and both side surfaces of the first active pattern which face each other, and the second doped region is formed to a uniform width in the second active pattern along the upper surface of the second active pattern and both side surfaces of the second active pattern which face each other.

In some embodiments of the inventive concept, the first doped region extends along the upper surface of the first active pattern to contact a first undoped region under the first spacer, and the second doped region extends along the upper surface of the second active pattern to contact a second undoped region under the second spacer.

In some embodiments of the inventive concept, an upper surface of the first doped region contacts part of a lower surface of the first spacer, and an upper surface of the second doped region contacts part of a lower surface of the second spacer.

In some embodiments of the inventive concept, the upper surface of the first doped region and a lower surface of the first gate pattern lie in the same plane, and the upper surface of the second doped region and a lower surface of the second gate pattern lie in the same plane.

According to another aspect of the present inventive concept, there is provided a method of fabricating a semiconductor device, the method comprises forming an active fin extending along a first direction; forming a field insulating layer exposing an upper part of the active fin, along long sides of the active fin; forming a dummy gate pattern extending along a second direction intersecting the first direction, on the active fin; forming a spacer on at least one side of the dummy gate pattern; forming a liner layer covering the active fin exposed by the spacer and the dummy gate pattern; forming a dopant supply layer containing a dopant element, on the liner layer; and forming a doped region in the active fin along an upper surface of the active fin by heat-treating the dopant supply layer.

In some embodiments of the inventive concept, the forming of the liner layer comprises forming the liner layer along the upper surface of the active fin and both side surfaces of the active fin which face each other after the forming of the spacer.

In some embodiments of the inventive concept, the forming of the doped region comprises forming the doped region in the active fin along the upper surface of the active fin and both side surfaces of the active fin which face each other, wherein the upper surface of the active fin lies in the same plane with a lower surface of the dummy gate pattern.

In some embodiments of the inventive concept, the method further comprises forming a source/drain region on the doped region.

In some embodiments of the inventive concept, the method further comprises forming a recess in the active fin on at least one side of the spacer before the forming of the liner layer, wherein the forming of the liner layer comprise forming the liner layer on a bottom surface of the recess and sidewalls of the recess which face each other.

In some embodiments of the inventive concept, the forming of the doped region comprises forming the doped region in the active fin along the bottom surface of the recess and the sidewalls of the recess which face each other and further comprising forming a source/drain region on the doped region.

In some embodiments of the inventive concept, the forming of the dopant supply layer comprises forming a dopant layer by knocking-in the dopant element and passivating the dopant layer.

In some embodiments of the inventive concept, the forming of the doped region comprises forming a pre-doped region in the active fin by performing a first heat treatment process on the dopant supply layer at a first temperature and forming the doped region by performing a second heat treatment process on the dopant supply layer and the pre-doped region at a second temperature higher than the first temperature.

In some embodiments of the inventive concept, the pre-doped region is formed by the diffusion of the dopant element into the active fin, and the doped region is formed to a uniform depth by the diffusion of the dopant element contained in the pre-doped region and the dopant element contained in the dopant supply layer into the active fin.

In some embodiments of the inventive concept, the forming of the doped region comprises forming the doped region to extend along the upper surface of the active fin and contact an undoped region under the spacer.

In some embodiments of the inventive concept, part of a lower surface of the spacer contacts an upper surface of the doped region.

In some embodiments of the inventive concept, the method further comprises sequentially removing the dopant supply layer and the liner layer after the forming of the doped region.

In some embodiments of the inventive concept, the method further comprises sequentially removing the dopant supply layer and the liner layer after the forming of the doped region.

In some embodiments of the inventive concept, the method of claim further comprises forming a trench by removing the dummy gate pattern and forming a gate pattern in the trench.

According to an aspect of the present inventive concept, there is provided a method of fabricating a semiconductor device, the method comprises forming an active fin which extending along a first direction; forming a field insulating layer exposing an upper part of the active fin, along long sides of the active fin; forming a dummy gate pattern extending along a second direction intersecting the first direction, on the active fin; forming a liner layer covering the active fin exposed by the dummy gate pattern; forming a dopant supply layer containing a dopant element, on the liner layer; forming a doped region in the active fin along an upper surface of the active fin and side surfaces of the active fin which face each other by heat-treating the dopant supply layer; and forming a source/drain region on the doped region.

In some embodiments of the inventive concept, the forming of the liner layer comprises forming the liner layer along the upper surface of the active fin and the side surfaces of the active fin which face each other.

In some embodiments of the inventive concept, the method further comprises sequentially removing the dopant supply layer and the liner layer after the forming of the doped region.

In some embodiments of the inventive concept, the forming of the doped region comprises forming a pre-doped region in the active fin by performing a first heat treatment process on the dopant supply layer at a first temperature and forming the doped region by performing a second heat treatment process on the dopant supply layer and the pre-doped region at a second temperature higher than the first temperature.

In some embodiments of the inventive concept, the pre-doped region is formed by the diffusion of the dopant element into the active fin, and the doped region is formed to a uniform depth by the diffusion of the dopant element contained in the pre-doped region and the dopant element contained in the dopant supply layer into the active fin.

According to an aspect of the present inventive concept, there is provided a method of fabricating a semiconductor device, the method comprises forming an active fin extending along a first direction; forming a field insulating layer exposing an upper part of the active fin, along long sides of the active fin; forming a dummy gate pattern extending along a second direction intersecting the first direction, on the active fin; forming a spacer on at least one side of the dummy gate pattern; forming a recess in the active fin exposed by the spacer and the dummy gate pattern; forming a liner layer which covers the recess; forming a dopant supply layer containing a dopant element, on the liner layer; and forming a doped region in the active fin along an upper surface of the recess to contact an undoped region under the spacer by heat-treating the dopant supply layer.

In some embodiments of the inventive concept, the method further comprises forming a source/drain region, which contacts the doped region, on the recess.

In some embodiments of the inventive concept, the method further comprises sequentially removing the dopant supply layer and the liner layer before the forming of the source/drain region.

In some embodiments of the inventive concept, the forming of the doped region comprises forming a pre-doped region in the recess by performing a first heat treatment process on the dopant supply layer at a first temperature and forming the doped region by performing a second heat treatment process on the dopant supply layer and the pre-doped region at a second temperature higher than the first temperature.

In some embodiments of the inventive concept, the pre-doped region is formed by the diffusion of the dopant element into the recess, and the doped region is formed to a uniform depth by the diffusion of the dopant element contained in the pre-doped region and the dopant element contained in the dopant supply layer into the recess.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
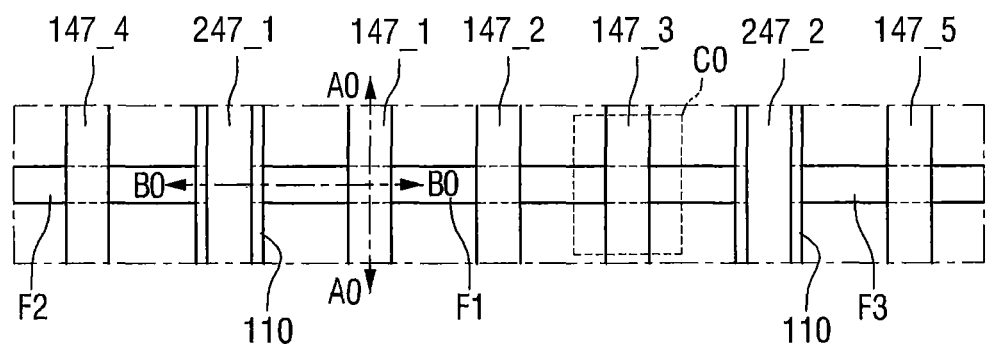
FIGS. 1 and 2 respectively are layout and perspective views of a semiconductor device according to example embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the disclosure to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, a semiconductor device according to embodiments of the present inventive concept will be described with reference to FIGS. 1 through 6.

Figure 2:
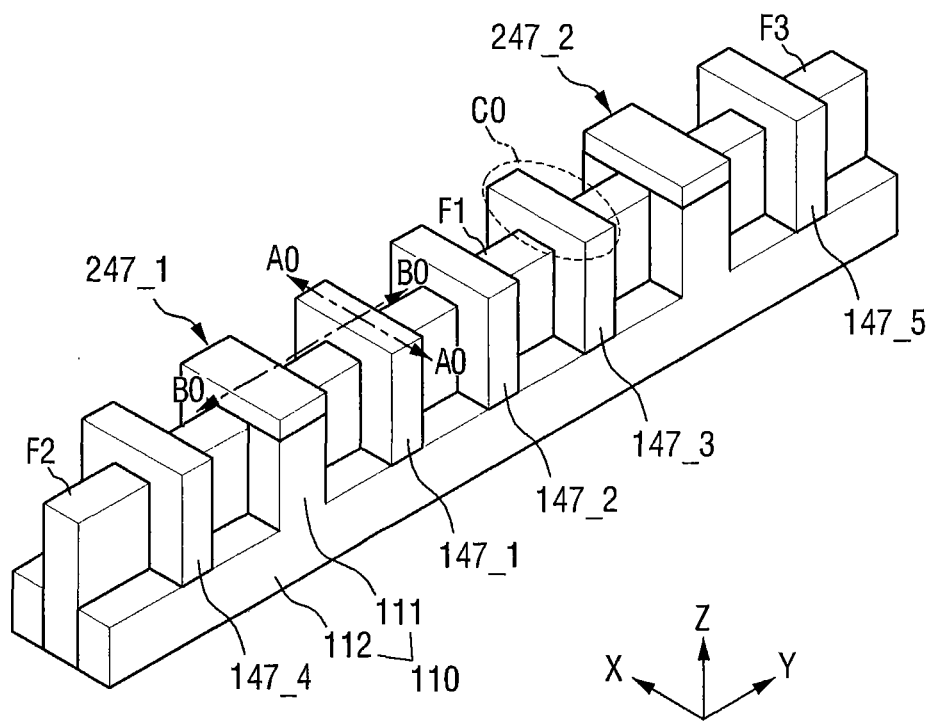
Figure 3:
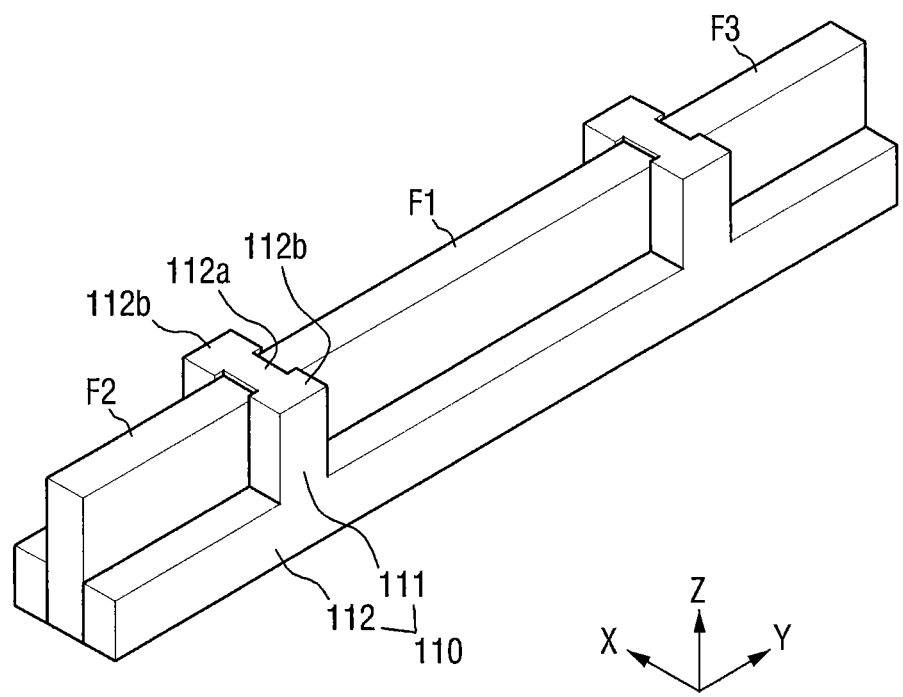
FIG. 3 is a view excluding normal gates and dummy gates from FIG. 2.
Figure 4:
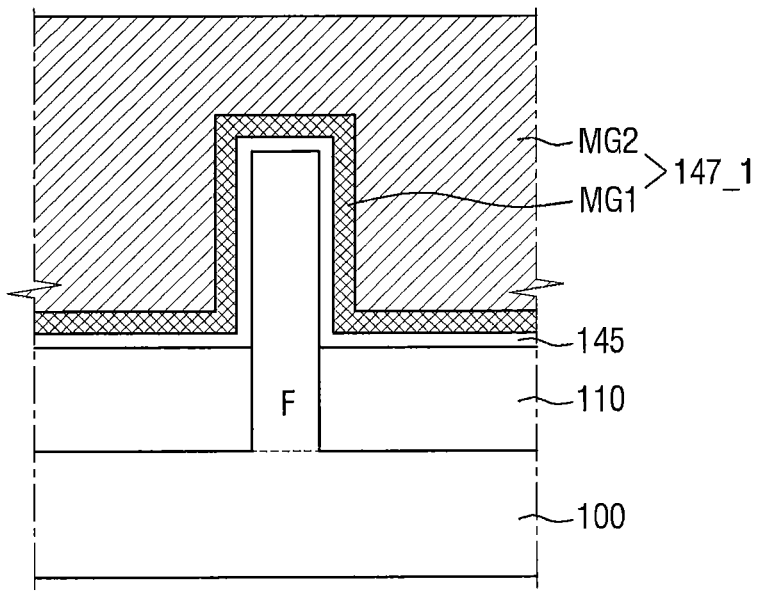
FIG. 4 is a cross-sectional view taken along the line A0-A0 of FIGS. 1 and 2.
Figure 5:
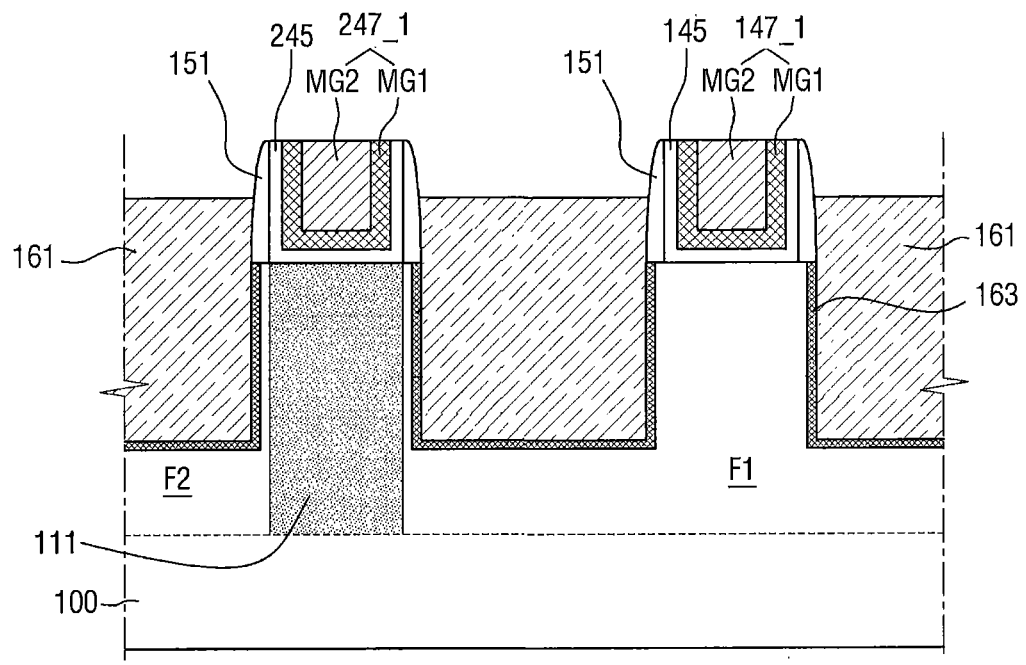
FIG. 5 is a cross-sectional view taken along the line B0-B0 of FIGS. 1 and 2.
Figure 6:
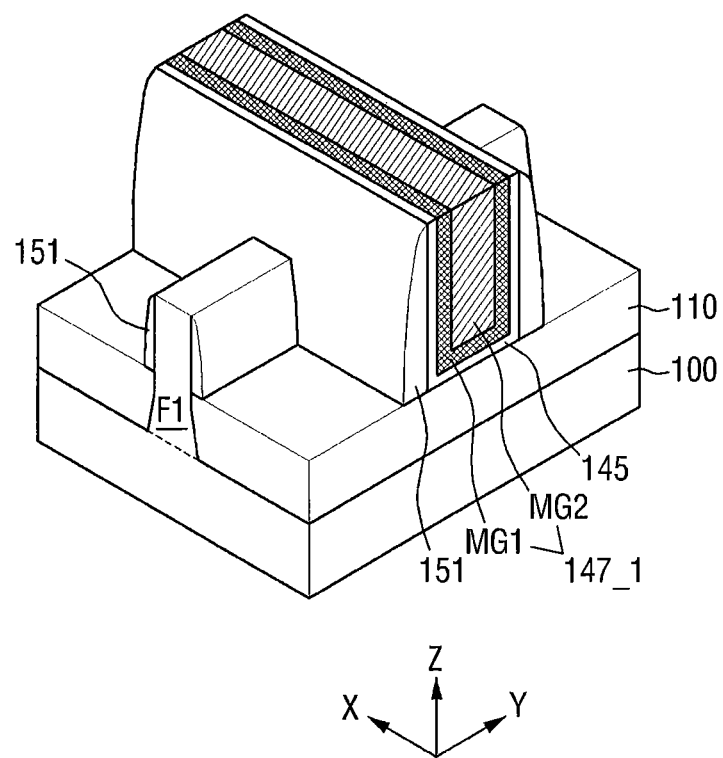
FIG. 6 is a detailed perspective view of an area C0 of FIGS. 1 and 2.

FIGS. 1 and 2 respectively are layout and perspective views of a semiconductor device according to example embodiments of the present inventive concept. FIG. 3 is a partial perspective view of active patterns F1 through F3 and a field insulating layer 110 of the semiconductor device illustrated in FIGS. 1 and 2. Here, FIG. 3 is a view excluding normal gates 147_1 through 147_5 and dummy gates 247_1 and 247_2 from FIG. 2. FIG. 4 is a cross-sectional view taken along the line A0-A0 of FIGS. 1 and 2. FIG. 5 is a cross-sectional view taken along the line B0-B0 of FIGS. 1 and 2. FIG. 6 is a detailed perspective view of an area C0 of FIGS. 1 and 2.

Referring to FIGS. 1 through 6, the semiconductor device according to the example embodiments of the present inventive concept may include a plurality of multi-channel active patterns F1 through F3, a plurality of normal gates 147_1 through 147_5, the field insulating layer 110, a plurality of dummy gates 247_1 and 247_2, and a plurality of source/drain regions 161. The multi-channel active patterns F1 through F3 may extend along a second direction Y. Each of the multi-channel active patterns F1 through F3 may be part of a substrate 100 or include an epitaxial layer grown from the substrate 100. In the drawings, three multi-channel active patterns F1 through F3 extend in a row along a lengthwise direction. However, the present inventive concept is not limited thereto.

In the drawings, each of the multi-channel active patterns F1 through F3 is shaped like a rectangular parallelepiped. However, the shape of each of the multi-channel active patterns F1 through F3 is not limited to the rectangular parallelepiped. That is, each of the multi-channel active patterns F1 through F3 can have a chamfered shape, i.e., can have rounded corners. Each of the multi-channel active patterns F1 through F3 extending along the second direction Y may include long sides extending along the second direction Y and short sides extending along a first direction X. Even if the corners of the multi-channel active patterns F1 through F1 are rounded, it is obvious that the long and short sides of the multi-channel active patterns F1 through F3 can be distinguished by those of ordinary skill in the art.

Each of the multi-channel active patterns F1 through F3 may be a fin- or nanowire-shaped body. In the drawings, each of the multi-channel active patterns F1 through F3 is fin-shaped. Each of the multi-channel active patterns F1 through F3 denotes an active pattern used in a multi-gate transistor. That is, when each of the multi-channel active patterns F1 through F3 is shaped like a fin, a channel may be formed along three surfaces of the fin, or channels may respectively be formed in two surfaces of the fin which face each other. Alternatively, when each of the multi-channel active patterns F1 through F3 is shaped like a nanowire, a channel may be formed around the nanowire. The field insulating layer 110 may be formed on the substrate 100 and partially surround each of the multi-channel active patterns F1 through F3.

Specifically, the field insulating layer 110 may include a second region 112 and a first region 111 disposed on the second region 112. The first region 111 may contact the short sides of the multi-channel active patterns F1 through F3, and the second region 112 may contact the long sides of the multi-channel active patterns F1 through F3.

The first region 111 may be formed under the dummy gates 247_1 and 247_2, and the second region 112 may be formed under the normal gates 147_1 through 147_5. In other words, a part (i.e., the first region 112) of the field insulating layer 110 may be disposed between multi-channel active patterns (e.g., between F1 and F2 and between F2 and F3) which face each other. The first region 111 may extend along the first direction X, and the second region 112 may extend along the second direction Y.

In addition, referring to FIG. 3, the field insulating layer 110 may cover ends of the multi-channel active patterns F1 through F3. That is, the first region 111 may include a first part 112a and a second part 112b. The first part 112a and the second part 112b may have different widths. Specifically, the second part 112b may be wider than the first part 112a. As a result, the second part 112b may cover the ends of the multi-channel active patterns F1 through F3. This structure can prevent the misalignment of the field insulating layer 110 with the dummy gates 247_1 and 247_2 which are to be formed on the field insulating layer 110. The field insulating layer 110 may be an oxide layer, a nitride layer, an oxynitride layer, or a combination of these layers.

The normal gates 147_1 through 147_5 may be formed on corresponding multi-channel active patterns F1 through F3 to intersect the corresponding multi-channel active patterns F1 through F3. For example, the first through third normal gates 147_1 through 147_3 may be formed on the first multi-channel active pattern F1, the fourth normal gate 147_4 may be formed on the second multi-channel active pattern F2, and the fifth normal gate 147_5 may be formed on the third multi-channel active pattern F3. The normal gates 147_1 through 147_5 may extend along the first direction X.

Each of the dummy gates 247_1 and 247_2 may be formed on a corresponding region (i.e., the first region 111) of the field insulating layer 110. For example, the first dummy gate 247_1 may be formed on the first region 111 on the left side of FIG. 2, and the second dummy gate 247_2 may be formed on the first region 111 on the right side of FIG. 2. In particular, each of the dummy gates 247_1 and 247_2 may be formed on a corresponding first region 111. Since only one dummy gate 247_1 or 247_2, instead of two or more dummy gates, is formed on the corresponding first region 111, the layout size can be reduced.

Referring to FIGS. 4 and 6, each normal gate (e.g., 147_1) may include metal layers (MG1, MG2). For example, the normal gate 147_1 may be formed by stacking two or more metal layers (MG1, MG2) as illustrated in the drawings. A first metal layer MG1 may control a work function, and a second metal layer MG2 may fill a space formed by the first metal layer MG1. The first metal layer MG1 may contain at least one of, but not limited to, TiN, TaN, TiC and TaC. In addition, the second metal layer MG2 may contain W or Al. The normal gate 147_1 may be formed by, but not limited to, a replacement process (or a gate last process). In the drawings, the normal gate 147_1 includes a doped region 163 according to the embodiments of the present inventive concept. The doped region 163 will be described later.

Each dummy gate (e.g., 247_1) may have a similar structure to the normal gate 147_1. The dummy gate 247_1 may be formed by stacking two or more metal layers (MG1, MG2) as illustrated in the drawings. For example, a first metal layer MG1 may control a work function, and a second metal layer MG2 may fill a space formed by the first metal layer MG1. However, the present inventive concept is not limited thereto. Unlike the normal gate 147_1, each dummy gate (e.g., 247_1) may be formed of an oxide layer. That is, each dummy gate may include an oxide layer instead of a metal layer (MG1, MG2).

A gate insulating layer 145 may be formed between the multi-channel active pattern F1 and the normal gate 147_1. As illustrated in FIG. 5, the gate insulating layer 145 may be formed on an upper surface of the multi-channel active fin F1 and upper parts of side surfaces of the multi-channel active pattern F1. In addition, the gate insulating layer 145 may be disposed between the normal gate 147_1 and the field insulating layer 110 (i.e., the second region 112). The gate insulating layer 145 may include a high-k material having a higher dielectric constant than a silicon oxide layer. For example, the gate insulating layer 145 may contain $HfO_2$, $ZrO_2$, or $Ta_2O_5$. In the current embodiments, the gate insulating layer 145 may extend upward along sidewalls of the normal gate 147_1 or the dummy gate 247_1. This may be because the normal gate 147_1 or the dummy gate 247_1 has been formed by, e.g., a gate last process.

Referring again to FIGS. 1 through 5, the source/drain regions 161 may be disposed between the normal gates 147_1 through 147_5 and between normal gates (e.g., 147_1 and 147_4) and a dummy gate (e.g., 247_1). Each of the source/drain regions 161 may include an epitaxial layer. That is, each of the source/drain regions 161 may be formed by epitaxial growth. The source/drain regions 161 may be elevated source/drain regions which protrude further upward than the multi-channel active patterns F1 through F3. That is, upper surfaces of the source/drain regions 161 may be higher than lower surfaces of the normal gates 147_1 through 147_5 or the dummy gates 247_1 and 247_2.

Spacers 151 may include at least one of a nitride layer and an oxynitride layer. The spacers 151 may be formed on sidewalls of the multi-channel active patterns F1 through F3, the normal gates 147_1 through 147_5, and the dummy gates 247_1 and 247_2. In the drawings, a side surface of each of the spacers 151 is curved. However, the present inventive concept is not limited thereto. The shape of each of the spacers 151 can be changed as desired. For example, in some embodiments of the present inventive concept, each of the spacers 151 may be 'I'- or 'L'-shaped. The substrate 100 may be made of one or more semiconductor materials selected from the group consisting of Si, Ge, SiGe, GaP, GaAs, SiC, SiGeC, InAs and InP. Alternatively, the substrate 100 may be a silicon-on-insulator (SOI) substrate.

Referring to FIGS. 2 and 5, as described above, the first region 111 of the field insulating layer 110 may be disposed on the second region 112. An upper surface of at least a part (i.e., the first region 111) of the field insulating layer 110 may be at substantially the same height as the upper surfaces of the multi-channel active patterns F1 through F3. In other words, the upper surface of the first region 111 may be formed lower than the upper surfaces of the source/drain regions 161.

However, the present inventive concept is not limited thereto. In some other embodiments of the present inventive concept, the upper surface of the first region 111 can be formed lower than the upper surfaces of the multi-channel active patterns F1 through F3. That is, in the drawings, the upper surface of the first region 111 is at substantially the same height as the upper surfaces of the multi-channel active patterns F1 through F3. However, the present inventive concept is not limited thereto. Upper surfaces of the dummy gates 247_1 and 247_2 may lie in the same plane with upper surfaces of the normal gates 147_1 through 147_5. For example, if the dummy gates 247_1 and 247_2 and the normal gates 147_1 through 147_5 are formed by a planarization process, the upper surfaces thereof may lie in the same plane.

The relationships among the multi-channel active patterns F1 through F3, the field insulating layer 110, the normal gates 147_1 through 147_5 and the dummy gates 247_1 and 247_2 of the semiconductor device have been described above with reference to FIGS. 1 through 6. A semiconductor device according to embodiments of the present inventive concept which will be described below may be, but is not limited to, a semiconductor device that can be formed in the area C0.

Figure 7:
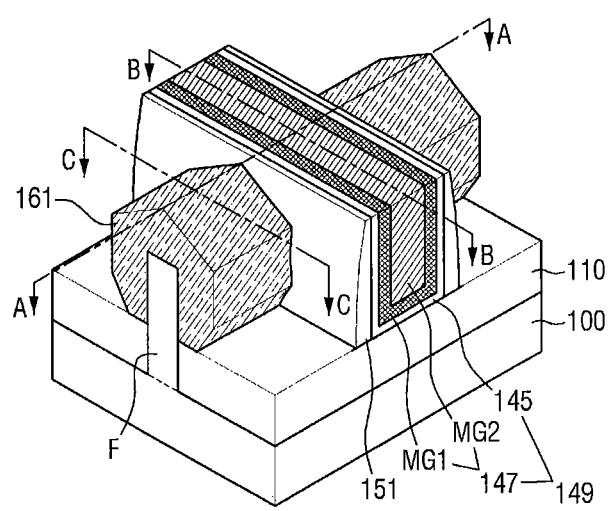
FIG. 7 is a perspective view of a semiconductor device according to example embodiments of the present inventive concept.
Figure 8:
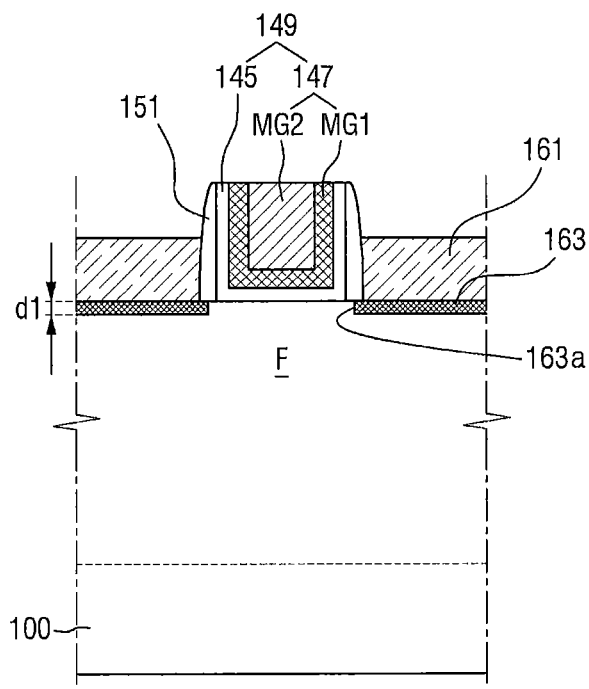
FIG. 8 is a cross-sectional view taken along the line A-A of FIG. 7.
Figure 9:
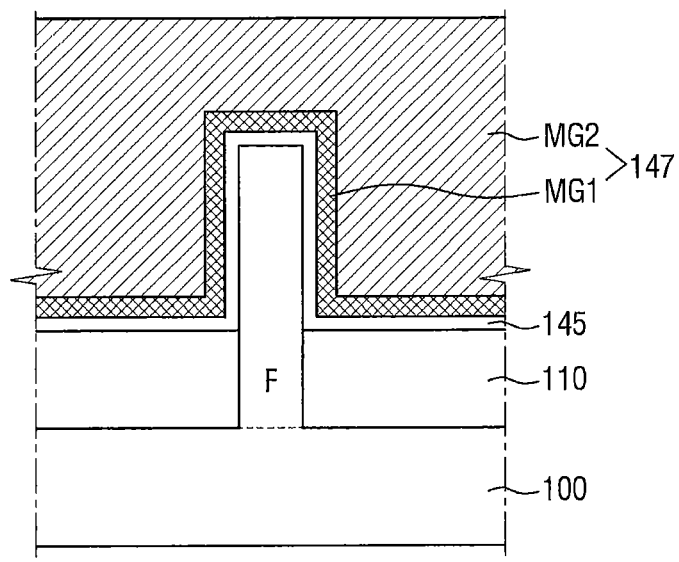
FIG. 9 is a cross-sectional view taken along the line B-B of FIG. 7.
Figure 10:
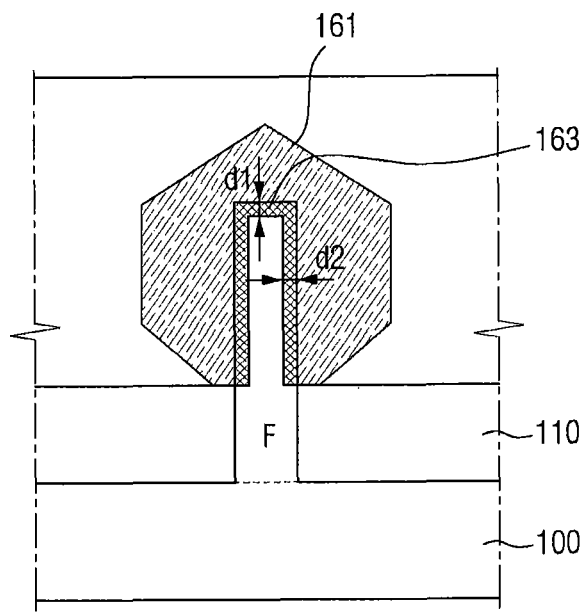
FIG. 10 is a cross-sectional view taken along the line C-C of FIG. 7.

FIG. 7 is a perspective view of a semiconductor device 10 according to embodiments of the present inventive concept. FIG. 8 is a cross-sectional view taken along the line A-A of FIG. 7. FIG. 9 is a cross-sectional view taken along the line B-B of FIG. 7. FIG. 10 is a cross-sectional view taken along the line C-C of FIG. 7. FIG. 7 illustrates a gate pattern 149 and source/drain regions 161, excluding an interlayer insulating film formed on a field insulating layer 110.

Referring to FIG. 7, the semiconductor device 10 includes an active fin F, the gate pattern 149, the source/drain regions 161, and spacers 151.

The active fin F may be, e.g., a fin or a nanowire. In the semiconductor device according to the embodiments of the present inventive concept, the active fin F may be fin-shaped and may be a multi-channel active pattern described in the previous embodiments. An upper surface of the active fin F may be higher than an upper surface of the field insulating layer 110.

In the embodiments of the present inventive concept, a case where the semiconductor device 10 is a fin transistor will be described. The active fin F may extend along a second direction Y. The active fin F may be part of a substrate 100 or include an epitaxial layer grown from the substrate 100. The field insulating layer 110 may cover side surfaces of the active fin F.

The gate pattern 149 may be formed on the substrate 100 and intersect the active fin F. For example, the gate pattern 149 may extend along a first direction X. The gate pattern 149 may include a gate electrode 147 and a gate insulating layer 145.

The gate electrode 147 may include metal layers (MG1, MG2). The gate electrode 147 may be formed by stacking two or more metal layers (MG1, MG2) as illustrated in the drawings. A first metal layer MG1 may control a work function, and a second metal layer MG2 may fill a space formed by the first metal layer MG1. For example, the first metal layer MG1 may contain at least one of TiN, TaN, TiC, and TaC. In addition, the second metal layer MG2 may contain W or Al. Alternatively, the gate electrode 147 may be made of Si or SiGe other than a metal. The gate electrode 147 may be formed by, but not limited to, a replacement process.

The gate insulating layer 145 may be formed between the active fin F and the gate electrode 147. The gate insulating layer 145 may be formed on the upper surface of the active fin F and upper parts of the side surfaces of the active fin F. In addition, the gate insulating layer 145 may be disposed between the gate electrode 147 and the field insulating layer 110. The gate insulating layer 145 may contain a high-k material having a higher dielectric constant than a silicon oxide layer. For example, the gate insulating layer 145 may contain one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The source/drain regions 161 are formed on both sides of the gate pattern 149, respectively. Specifically, the source/drain regions 161 may be formed on the upper surface of the active fin F which protrudes further upward than the field insulating layer 110. The source/drain regions 161 may be clad source/drain regions. That is, the source/drain regions 161 may be disposed on the upper surface of the protruding active fin F1 and both side surfaces of the active fin F which face each other. In addition, the source/drain regions 161 may be insulated from the gate pattern 149 by the spacers 151. In FIG. 7, the source/drain regions 161 are polygonal. However, the shape of each of the source/drain regions 161 is not limited to the polygonal shape.

When the semiconductor device 10 is a p-channel metal oxide semiconductor (PMOS) fin transistor, the source/drain regions 161 may contain a compressive stress material. In an example, the compressive stress material may be a material (e.g., SiGe) having a greater lattice constant than Si. The compressive stress material can improve the mobility of carriers in a channel region by applying compressive stress to the active fin F. On the other hand, when the semiconductor device 10 is an n-channel metal oxide semiconductor (NMOS) fin transistor, the source/drain regions 161 may contain the same material as the substrate 100 or a tensile stress material. In an example, when the substrate 100 is Si, the source/drain regions 161 may be Si or a material (e.g., SiC) having a smaller lattice constant than Si.

The spacers 151 may be formed on both side surfaces of the gate pattern 149, respectively. The spacers 151 may contain at least one of a nitride layer and an oxynitride layer. In the drawings, each of the spacers 151 is a single layer. However, each of the spacers 151 can also be formed as a multilayer. The substrate 100 may be, for example, a bulk silicon substrate or an SOI substrate. Otherwise, the substrate 100 may be a silicon substrate or may be a substrate made of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

Referring to FIGS. 8 through 10, the active fin F protruding further upward than the field insulating layer 110 extends along the second direction Y. The upper surface of the active fin F in an area in which the source/drain regions 161 are disposed may lie in the same plane with a lower surface of the gate pattern 149.

Specifically, the active fin F protruding further upward than the field insulating layer 110 may be formed under the gate pattern 149 and intersect the gate pattern 149. Since the active fin F does not include a recess, the gate pattern 149 and the source/drain regions 161 disposed on the upper surface of the active fin F may lie in the same plane. A doped region 163 may be formed in the active fin F along the upper surface of the active fin F. Specifically, the doped region 163 may be formed along the upper surface of the active fin F and both side surfaces of the active fin F which face each other. The doped region 163 may include a first dopant having a first concentration.

In the present inventive concept, a region without the first dopant may be referred to as an undoped region, but the present inventive concept is not limited thereto.

Here, when the doped region 163 is formed in the active fin F along the upper surface of the active fin F, it may denote that the doped region 163 is formed in the active fin F along a boundary part between the active fin F and another layer. That is, referring to FIGS. 8 and 10, the boundary part between the active fin F and the source/drain regions 161 may be the upper surface of the active fin F and both side surfaces of the active fin F which face each other.

The doped region 163 formed along the upper surface of the active fin F and both side surfaces of the active fin F which face each other may be continuous. The doped region 163 may be formed to a first depth d1 on the upper surface of the active fin F and to a second depth d2 on both side surfaces of the active fin F which face each other. The first depth d1 and the second depth d2 of the doped region 163 may be substantially equal to each other. That is, the doped region 163 may be formed to a uniform depth in the active fin F along the upper surface of the active fin F and both side surfaces of the active fin F which face each other and along the boundary part between the active fin F and the source/drain regions 161. The first dopant included in the doped region 163 may contain at least one of, e.g., arsenic (As), phosphorous (P), boron (B), and carbon (C). In embodiments of the present inventive concept described below, a case where the first dopant is arsenic will be described. However, this is merely an example, and the technical spirit of the present inventive concept is not limited to this example.

The doped region 163 may be formed along the upper surface of the active fin F, excluding an area in which the gate pattern 149 is formed. Specifically, doped ends 163a of the doped region 163 may be disposed on lower surfaces of the spacers 151. That is, the doped region 163 may extend toward the gate pattern 149 along the upper surface of the active fin F to be disposed under the spacers 151. In addition, the doped region 163 and the undoped region may contact each other under the spacers 151. However, the present inventive concept is not limited thereto. The doped region 163 may be a lightly doped region.

Each of the source/drain regions 161 may contact the doped region 163. The source/drain regions 161 may include a second dopant having a second concentration. The second concentration of the second dopant included in the source/drain regions 161 may be different from the first concentration of the first dopant included in the doped region 163. In the semiconductor device 10 according to the embodiments of the present inventive concept, the second concentration of the second dopant may be higher than the first concentration of the first dopant. The source/drain regions 161 may be, for example, highly doped regions. The doped region 163 may alleviate the high concentration of an electric field between the source/drain regions 161 having a high dopant concentration and the active fin F. Accordingly, this reduces the parasitic resistance of the semiconductor device 10, thus securing high current driving characteristics. The second dopant included in the source/drain regions 161 may be, but is not limited to, the same as the first dopant included in the doped region 163.

Referring again to FIG. 8, the gate pattern 149 and the spacers 151 are formed on the upper surface of the active fin F. The spacers 151 are formed on both side surfaces of the gate pattern 149, respectively. Referring to FIG. 9, the field insulating layer 110 is formed on a lower part of the active fin F formed on the substrate 100. The gate insulating layer 145 is formed on the active fin F which protrudes further upward than the field insulating layer 110, and the gate electrode 147 including the first metal layer MG1 and the second metal layer MG2 is formed on the gate insulating layer 145. In FIG. 7, the doped region 163 is not formed on the active fin F which intersects the gate insulating layer 145.

Referring again to FIG. 10, the doped region 163 is formed to a uniform depth (d1, d2) in the active fin F. The doped region 163 is surrounded by each of the source/drain regions 161 and contacts each of the source/drain regions 161.

A method of fabricating a semiconductor device according to example embodiment of the present inventive concept will now be described with reference to FIGS. 7 and 11 through 28.

Figure 17:
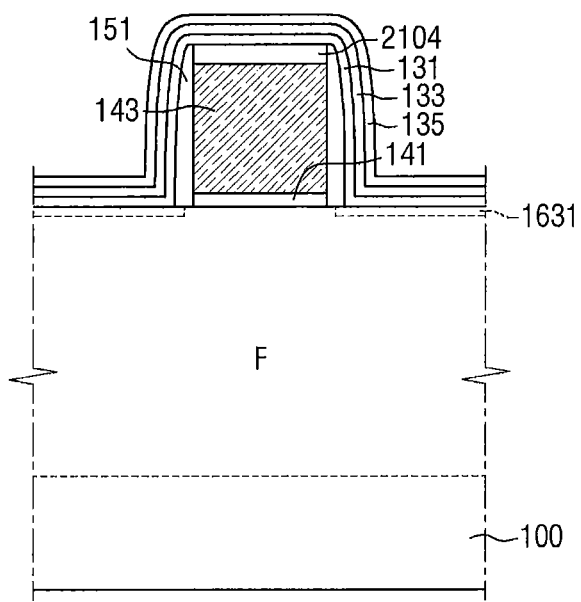
Figure 18:
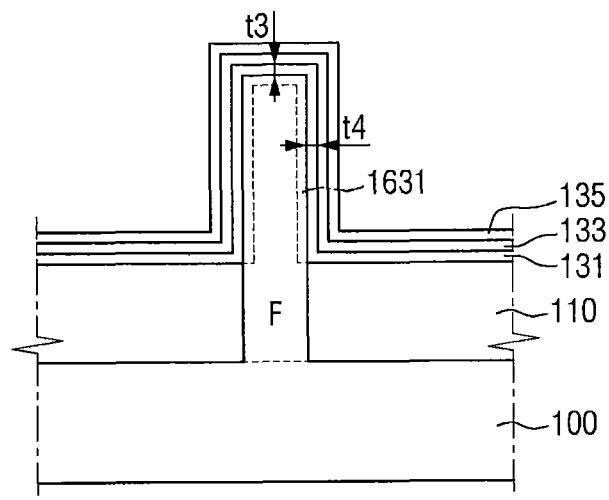

FIGS. 11 through 28 are views illustrating steps of a method of fabricating a semiconductor device according to the example embodiment of the present inventive concept. FIG. 17 is a cross-sectional view taken along the line D-D of FIG. 16. FIG. 18 is a cross-sectional view taken along the line E-E of FIG. 16. FIG. 20 is a cross-sectional view taken along the line D-D of FIG. 19. FIG. 21 is a cross-sectional view taken along the line E-E of FIG. 19. FIG. 23 is a cross-sectional view taken along the line D-D of FIG. 22. FIG. 24 is a cross-sectional view taken along the line E-E of FIG. 22.

Figure 11:
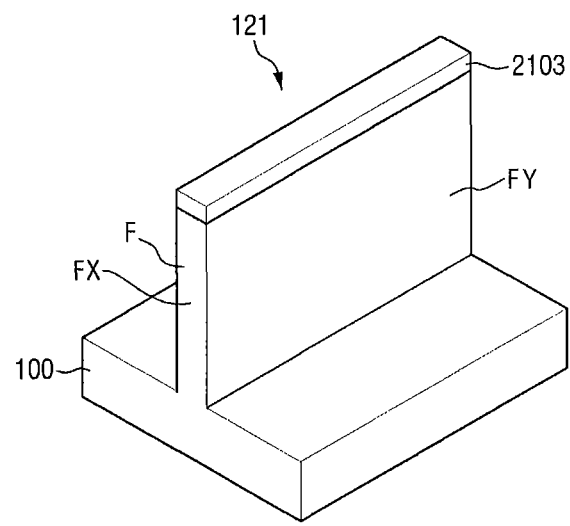
FIGS. 11 through 28 are views illustrating steps of fabricating a semiconductor device according to example embodiments of the present inventive concept.

Referring to FIG. 11, an active fin F is formed on a substrate 100. Specifically, a mask pattern 2103 is formed on the substrate 100, and then an etching process is performed to form the active fin F. The active fin F may extend along a second direction Y. The active fin F may include short sides FX extending along a first direction X and long sides FY extending along the second direction Y. A trench 121 is formed around the active fin F. The mask pattern 2103 may be made of a material including at least one of a silicon oxide layer, a silicon nitride layer and a silicon oxynitride layer.

Figure 12:
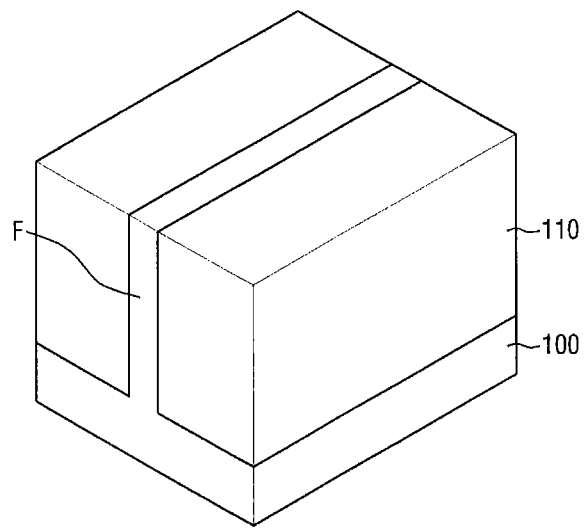

Referring to FIG. 12, a field insulating layer 110 is formed to fill the trench 121. The field insulating layer 110 may be made of a material including at least one of a silicon oxide layer, a silicon nitride layer and a silicon oxynitride layer. The active fin F and the field insulating layer 110 may be made to lie in the same plane by a planarization process. The mask pattern 2103 can be removed by the planarization process, but the present inventive concept is not limited thereto.

Figure 13:
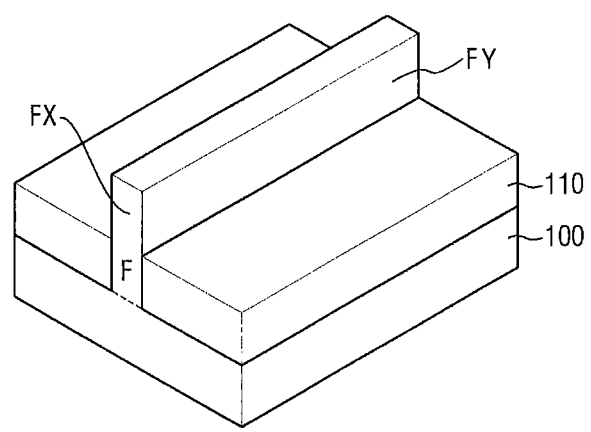

Referring to FIG. 13, an upper part of the field insulating layer 110 is recessed, thereby exposing an upper part of the active fin F. The recess process may include a selective etching process. That is, the active fin F is formed to protrude further upward than the field insulating layer 110. The field insulating layer 110 may be formed along the long sides FY of the active fin F.

The upper part of the active fin F which protrudes further upward than the field insulating layer 110 can also be formed by an epitaxial process. Specifically, after the formation of the field insulating layer 110, an epitaxial process, not the recess process, may be performed using an upper surface of the active fin F, which is exposed by the field insulating layer 110, as a seed. As a result, the upper part of the active fin F may be formed. In addition, a doping process for controlling a threshold voltage may be performed on the active fin F. When a semiconductor device 10 is an NMOS fin transistor, a dopant used here may be boron (B). When the semiconductor device 10 is a PMOS fin transistor, the dopant used here may be phosphorous (P) or arsenic (As).

Figure 14:
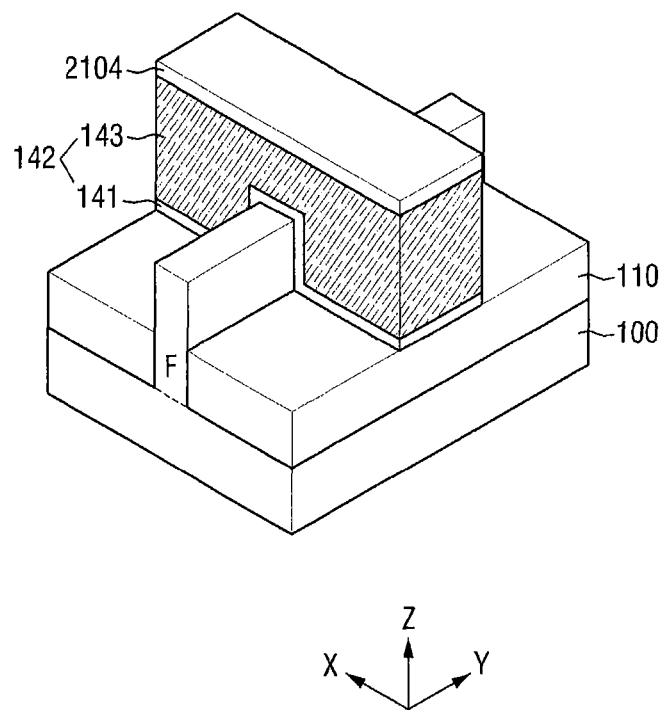

Referring to FIG. 14, an etching process is performed using a mask pattern 2104, thereby forming a dummy gate pattern 142 which intersects the active fin F and extends along the first direction X. Accordingly, the dummy gate pattern 142 is formed on the active fin F. The dummy gate pattern 142 may intersect part of the active fin F. The active fin F includes a part covered by the dummy gate pattern 142 and a part exposed by the dummy gate pattern 142.

The dummy gate pattern 142 includes a dummy gate insulating layer 141 and a dummy gate electrode 143. For example, the dummy gate insulating layer 141 may be a silicon oxide layer, and the dummy gate electrode 143 may be polysilicon.

Figure 15:
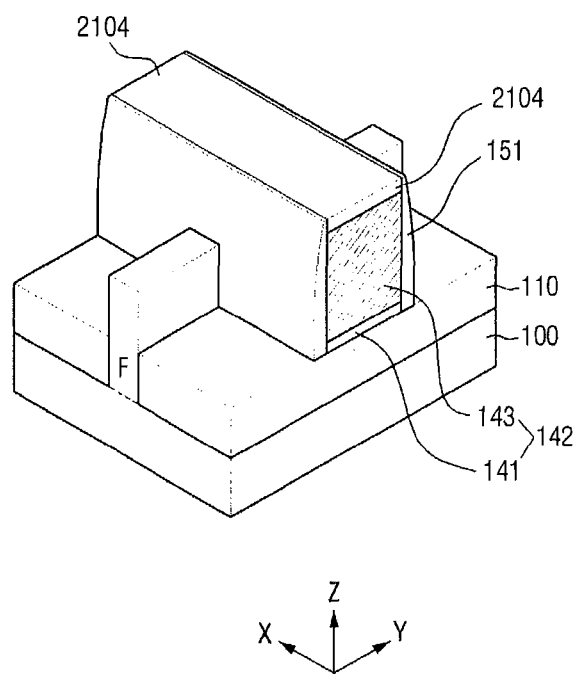
Figure 16:
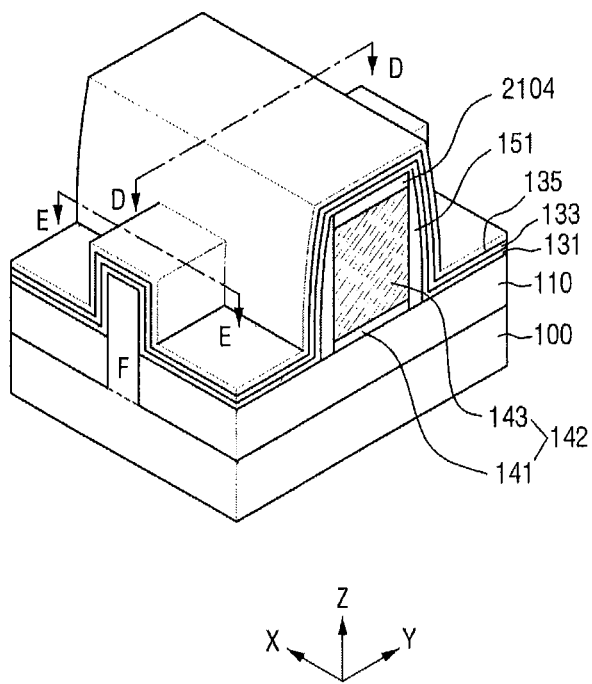

Referring to FIG. 15, spacers 151 may be formed on side surfaces of the dummy gate pattern 142. Specifically, after an insulating layer is formed on the dummy gate pattern 142, an etch-back process may be performed to form the spacers 151. The spacers 151 may expose an upper surface of the mask pattern 2104 and the active fin F. Each of the spacers 151 may be, for example, a silicon nitride layer or a silicon oxynitride layer.

Referring to FIGS. 15 through 18, a linerlayer 131 and a dopant supply layer 133 may be sequentially formed on the upper surface of the active fin F. The liner layer 131 and the dopant supply layer 133 may also be formed on the upper and side surfaces of the active fin F which do not intersect the dummy gate pattern 142. Further, the liner layer 131 and the dopant supply layer 133 may be formed on side surfaces of the spacers 151. The liner layer 131 may be formed to a uniform thickness on the upper and side surfaces of the active fin F which are exposed on the side surfaces of the spacers 151 and the dummy gate pattern 142. In other words, the liner layer 131 formed on the upper surface of the active fin F may have a third thickness t3, and the liner layer 131 formed on both side surfaces of the active fin F which face each other may have a fourth thickness t4. In this case, the third thickness t3 of the liner layer 131 may be substantially equal to the fourth thickness t4 of the liner layer 131.

A byproduct layer 135 may further be formed on the dopant supply layer 133 formed on the side surfaces of the spacers 151 and the upper and side surfaces of the active fin F. In the method of fabricating a semiconductor device according to the current embodiment, a case where the byproduct layer 135 is further formed on the dopant supply layer 133 is described. However, the present inventive concept is not limited to this case. Specifically, the liner layer 131 is formed on the spacers 151 and the active fin F. That is, the liner layer 131 is formed on the upper and side surfaces of the active fin F on which the dummy gate pattern 142 is not disposed and on the side surfaces of the spacers 151. The liner layer 131 may be conformally formed on the spacers 151 and the active fin F. The liner layer 131 formed on the side and upper surfaces of the active fin F may have a substantially uniform thickness. The liner layer 131 may contain at least one of silicon nitride and silicon oxide and may be formed as a multilayer, not a single layer. The liner layer 131 may be formed by, e.g., atomic layer deposition (ALD).

After the formation of the liner layer 131, a pre-amorphization implantation (PAI) process may be performed. An upper surface of a part of the active fin F which is exposed on the side surfaces of the dummy gate pattern 142 and the spacers 151 may be made amorphous by the PAI process. After the PAI process, the dopant supply layer 133 containing a first dopant element is formed on the active fin F. That is, the dopant supply layer 133 is formed on the liner layer 131. In the method of fabricating a semiconductor device according to the current embodiment, a case where a first dopant contained in the dopant supply layer 133 is arsenic is described. However, the present inventive concept is not limited to this case. That is, the first dopant contained in the dopant supply layer 133 may include one of phosphorous, boron and carbon.

The process of forming the dopant supply layer 133 will now be described in detail. First, arsenic plasma is formed using an arsenic-containing precursor gas (e.g., halogenated arsenic or hydrogenated arsenic) and a dilution gas. Here, the arsenic plasma contains arsenic ions and arsenic radicals. The arsenic radicals contained in the arsenic plasma may cause an arsenic layer (not illustrated) to be conformally formed on the liner layer 131. When the arsenic layer is formed, the arsenic ions contained in the arsenic plasma may be injected into the active fin F through the liner layer 131. The arsenic ions thus injected may form a dopant injected layer 1631 under the liner layer 131. The dopant injected layer 1631 may be formed along the upper surface of the active fin F which does not intersect the dummy gate pattern 142.

The arsenic layer can also be formed by a multi-step doping process. The multi-step doping process may be performed by changing process pressure, a bias applied to a substrate, a dose, plasma source power, the flow rate of the precursor gas, etc. When the arsenic layer is formed on the liner layer 131, if the process pressure is high, a thickness of the arsenic layer is increased, and the arsenic layer is formed conformally. Further, more arsenic ions are injected into the active fin F, and the dopant injected layer 1631 formed by the injection of the arsenic ions is formed conformally.

After the formation of the arsenic layer, the arsenic contained in the arsenic layer may be injected into the active fin F, which does not overlap the dummy gate pattern 142, using a knock-in gas. That is, the arsenic may be knocked into the active fin F. The knock-in gas may include at least one of an argon (Ar) gas, a neon (Ne) gas, a helium (He) gas, a hydrogen ($H_2$) gas, a krypton (Kr) gas, and a xenon (Xe) gas. The knocking of the arsenic into the active fin F may be performed optionally. First and second dopant injection processes using different types of knock-in gases can also be performed sequentially, thereby injecting the arsenic contained in the arsenic layer into the active fin F which does not overlap the dummy gate pattern 142. Alternatively, a dopant injection process using two or more knock-in gases can be performed to inject the arsenic contained in the arsenic layer into the active fin F which does not overlap the dummy gate pattern 142.

After the formation of the arsenic layer, the arsenic layer may be passivated. The arsenic layer is passivated because arsenic is a sublimation material. That is, the arsenic can sublimate and disappear before diffusing into the active fin F. In addition, when the arsenic layer comes into contact with the air, the surface of the arsenic layer formed conformally on the active fin F may become uneven. Thus, a doped region may not be formed evenly in the active fin F. The arsenic layer may be passivated using oxygen plasma. If the oxygen plasma is used, the arsenic layer formed on the liner layer 131 may be passivated by oxygen. In the process of passivating the arsenic layer, part of the arsenic layer may chemically react with a plasma gas used in the passivation process. In the current embodiment of the present inventive concept, the oxygen plasma is used as plasma for passivation. Therefore, the oxygen and the arsenic may chemically react with each other, thereby forming arsenic oxide ($As_xO_y$) on the liner layer 131. Accordingly, the dopant supply layer 133 may be formed on the liner layer 131. In the method of fabricating a semiconductor device according to the current embodiment, the dopant supply layer 133 may contain arsenic and arsenic oxide. Oxygen passivation may be performed in-situ.

After the dopant supply layer 133 is formed by oxygen passivation, the byproduct layer 135 may be formed on the dopant supply layer 133. Even if the arsenic layer is passivated using the oxygen plasma, some arsenic may reach with external hydrogen, thereby forming the byproduct layer 135. That is, in the method of fabricating a semiconductor device according to the current embodiment of the present inventive concept, the byproduct layer 135 may contain hydrogenated arsenic ($As_xH_y$). Consequently, the liner layer 131, the dopant supply layer 133 and the byproduct layer 135 may be formed sequentially on the active fin F which does not intersect the dummy gate pattern 142.

Figure 19:
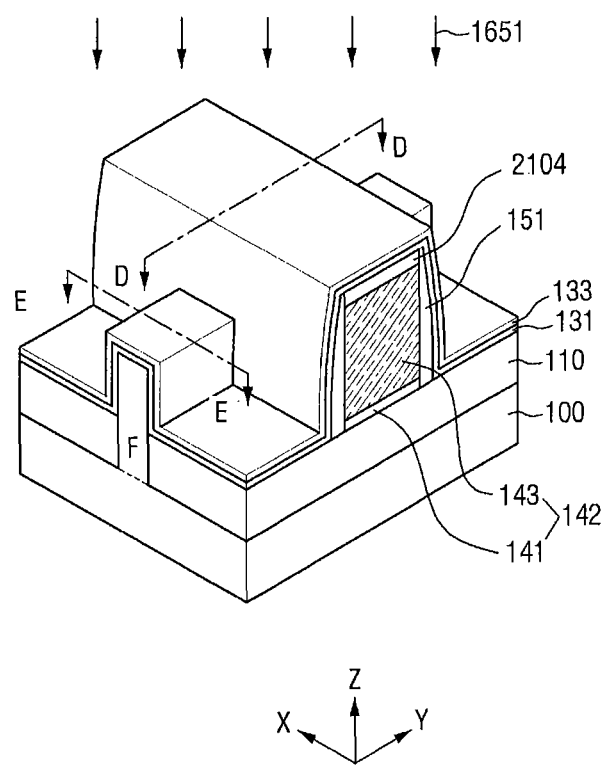
Figure 20:
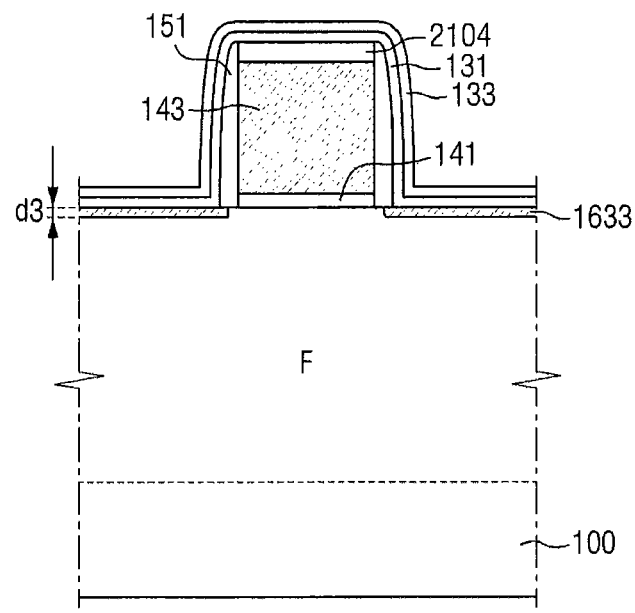
Figure 21:
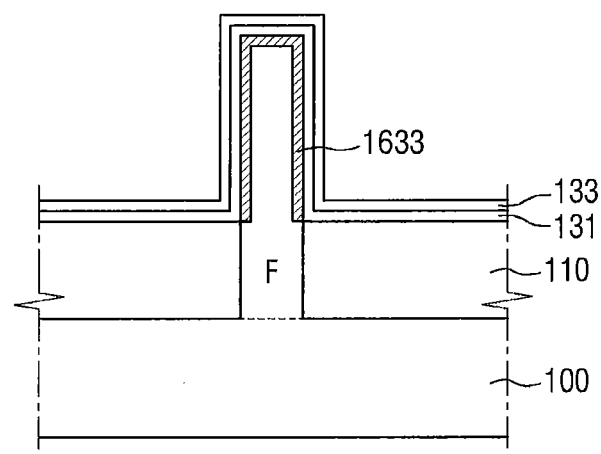

Referring to FIGS. 19 through 21, a first heat treatment process 1651 is performed on the dopant supply layer 133 at a first temperature, thereby forming a pre-doped region 1633 in the active fin F. The pre-doped region 1633 may be formed as the first dopant contained in the dopant supply layer 133 passes through the liner layer 131 and then diffuses into the active fin F. That is, the arsenic contained in the dopant supply layer 133 may diffuse into the active fin F through the liner layer 131, thereby forming the pre-doped region 1633. The pre-doped region 1633 may be formed to a third depth d3 in the active fin F.

Specifically, the first temperature at which the first heat treatment process 1651 is performed may be a temperature that can remove the byproduct layer 135 formed on the dopant supply layer 133 and facilitate the diffusion of the first dopant contained in the dopant supply layer 133. In the current embodiment, the first temperature may be a temperature that can sublimate the arsenic contained in the hydrogenated arsenic as well as a temperature that can diffuse the arsenic contained in the dopant supply layer 133 into the liner layer 131 and the active fin F. Specifically, the first temperature at which the first heat treatment process 1651 is performed may be 700° C. or below.

The first heat treatment process 1651 may be one of, e.g., furnace annealing, rapid thermal annealing (RTA), rapid thermal oxidation (RTO), plasma annealing, and microwave annealing. The first heat treatment process 1651 may result in the removal of the byproduct layer 135 formed on the dopant supply layer 133. That is, as the arsenic contained in the byproduct layer 135 sublimates, the byproduct layer 135 may be removed. At the same time as when the byproduct layer 135 is removed by the first heat treatment process 1651, the arsenic oxide and the arsenic contained in the dopant supply layer 133 may diffuse into the liner layer 131. In addition, the arsenic oxide and the arsenic which pass through the liner layer 131 may diffuse into the active fin F. In the method of fabricating a semiconductor device according to the current embodiment, if the active fin F is made of silicon, the arsenic oxide diffused into the active fin F may react with the active fin F, thereby forming SiOx:As. This is like a silicon oxide matrix doped with arsenic. As the arsenic oxide and the arsenic diffuse into the active fin F, the pre-doped region 1633 may be formed in the active fin F.

When the pre-doped region 1633 is formed in the active fin F, at least part of the dopant supply layer 133 formed on the liner layer 131 may be removed. That is, at least part of the dopant supply layer 133 which fails to diffuse into the liner layer 131 and the active fin F may be removed by the first heat treatment process 1651. In addition, when the pre-doped region 1633 is formed in the active fin F, the liner layer 131 formed on the active fin F may become thinner. Specifically, the liner layer 131 formed on the side surfaces of the active fin F may be thinner than the liner layer 131 formed on the upper surface of the active fin F. The thickness of the liner layer 131 formed on the side surfaces of the active fin F can also be substantially unchanged.

The first heat treatment process 1651 performed at a lower temperature than a second heat treatment process 1653 which will be performed subsequent to the first heat treatment process 1651 is a drive-in heat treatment process in which the first dopant contained in the dopant supply layer 133 is injected into the active fin F. In the method of fabricating a semiconductor device according to the current embodiment, the arsenic and the arsenic oxide are diffused into the active fin F by the first heat treatment process 1651. The first heat treatment process 1651 can control a solid phase epitaxy rate of the active fin F having a crystal lattice broken by the PAI process, thereby adjusting the junction depth and activation rate of the doped region.

Figure 22:
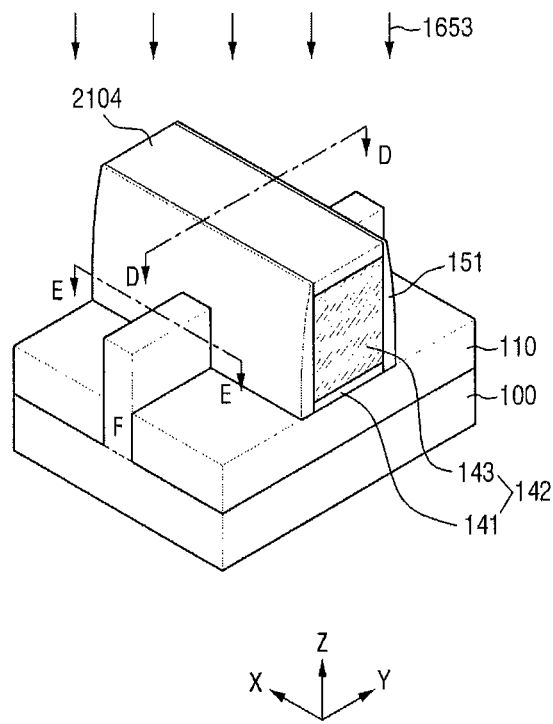
Figure 23:
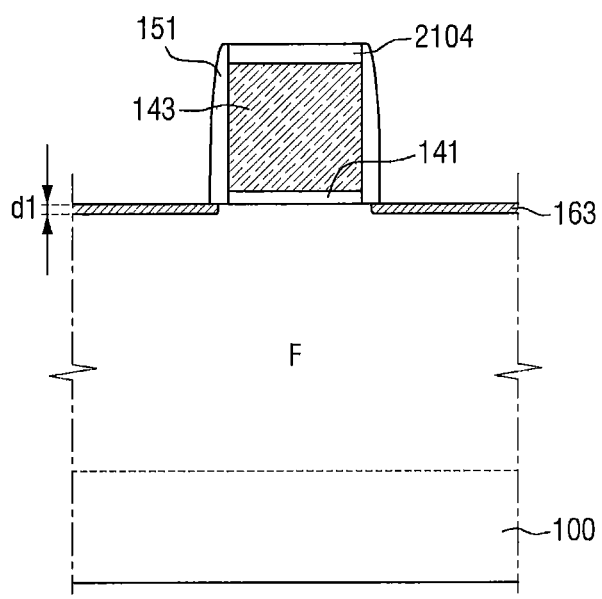
Figure 24:
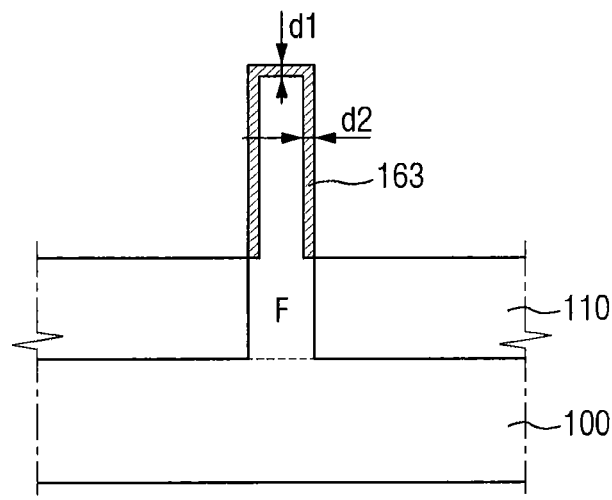

Referring to FIGS. 22 through 24, at a second temperature higher than the first temperature at which the first heat treatment process 1651 is performed, the second heat treatment process 1653 is performed on the dopant supply layer 133 and the pre-doped region 1633. The second heat treatment process 1653 causes a doped region 163 to be formed in the active fin F along the upper surface of the active fin F which does not intersect the dummy gate pattern 142.

The doped region 163 may be formed as the first dopant contained in the pre-doped region 1633 and the first dopant contained in the dopant supply layer 133 diffuse into the active fin F. That is, the arsenic contained in the pre-doped region 1633 and the arsenic contained in the dopant supply layer 133 may diffuse into the active fin F, thereby forming the doped region 163 doped with the arsenic. Specifically, the second temperature at which the second heat treatment process 1653 is performed is higher than the first temperature at which the first heat treatment process 1651 is performed. The second temperature at which the second heat treatment process 1653 is performed is a temperature that causes the arsenic contained in the pre-doped region 1633 and the arsenic contained in the dopant supply layer 133 to diffuse into the active fin F. In addition, the second temperature is a temperature that can sublimate the dopant supply layer 133 remaining after the arsenic or the arsenic oxide diffuses into the active fin F. Specifically, the second temperature at which the second heat treatment process 1653 is performed may be 1000° C. or above.

The second heat treatment process 1653 may be one of, e.g., spike RTA, flash RTA, and laser annealing. During the second heat treatment process 1653, the liner layer 131 formed on the upper surface of the active fin F and the upper surface of the dummy gate pattern 142 may be removed. Additionally, after the second heat treatment process 1653, any residue (such as a silicon-oxygen-arsenic compound) remaining on the upper surface of the active fin F and the liner layer 131 may be ashed/stripped. If the ashing/stripping process is performed after the second heat treatment process 1653, the ashing/stripping process and the second heat treatment process 1653 may be performed successively.

The doped region 163 formed in the active fin F has a first depth d1 on the upper surface of the active fin F and a second depth d2 on the side surfaces of the active fin F. Since the doped region 163 formed in the active fin F can be formed to a uniform depth along the upper surface of the active fin F, the first depth d1 and the second depth d2 may be substantially equal. In addition, since the doped region 163 is formed by the diffusion of some of the arsenic contained in the pre-doped region 163, the depth d1 of the doped region 163 may be greater than the depth d3 of the pre-doped region 1633. The doped region 163 may extend into the active fin F disposed on lower surfaces of spacers 151 formed on the side surfaces of the dummy gate pattern 142.

Figure 25:
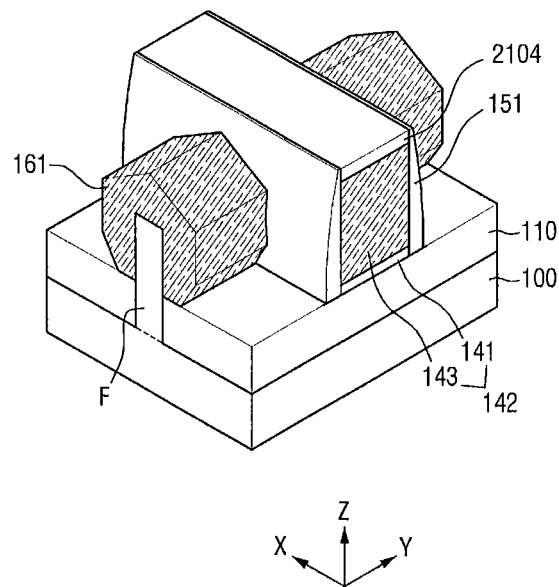

Referring to FIG. 25, source/drain regions 161 are formed on the active fin F disposed on both sides of the dummy gate pattern 142 and the spacers 151. The source/drain regions 161 may be formed by an epitaxial process. Each of the source/drain regions 161 may include a clad epitaxial layer. The material of the source/drain regions 161 may vary depending on whether a semiconductor device according to an embodiment of the present inventive concept is an n-type transistor or a p-type transistor. In addition, if necessary, a dopant may be used to in-situ-dope the source/drain regions 161 in the epitaxial process. Each of the source/drain regions 161 is polygonal in the drawing. However, the shape of each of the source/drain regions 161 is not limited to the polygonal shape.

Figure 26:
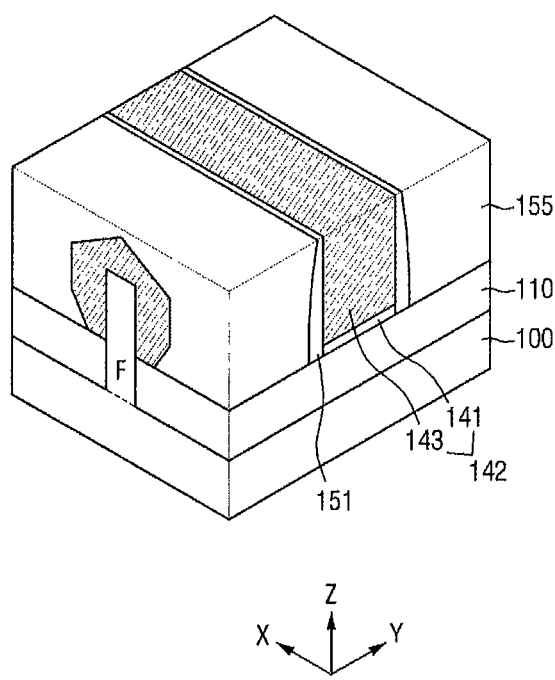

Referring to FIG. 26, an interlayer insulating film 155 is formed on the resultant structure having the source/drain regions 161. The interlayer insulating film 155 may include at least one of an oxide layer, a nitride layer, and an oxynitride layer. Then, the interlayer insluting film 155 is planarized until the upper surface of the dummy gate pattern 142 is exposed. As a result, the mask pattern 2104 is removed, and the upper surface of the dummy gate pattern 142 is exposed.

Figure 27:
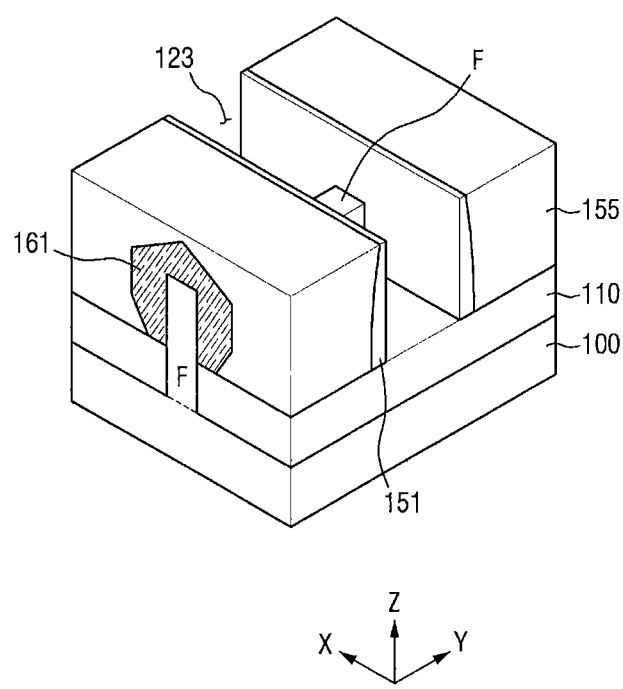
Figure 28:
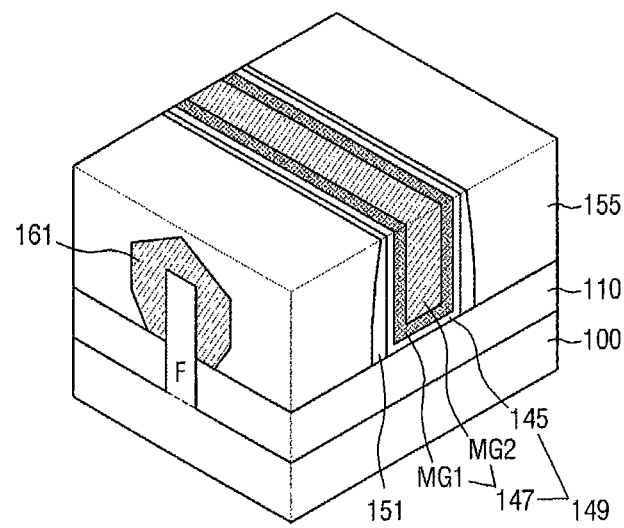

Referring to FIG. 27, the dummy gate pattern 142, that is, the dummy gate insulating layer 141 and the dummy gate electrode 143 are removed. The removal of the dummy gate insulating layer 141 and the dummy gate electrode 143 results in the formation of a trench 123 which exposes the field insulating layer 110 and part of the active fin F. Referring to FIG. 28, a gate insulating layer 145 and a gate electrode 147 are formed in the trench 123, thereby forming a gate pattern 149.

A semiconductor device according to embodiments of the present inventive concept includes the doped region 163 formed evenly along the surface of the active fin F. The doped region 163 may be a highly doped region. The doped region 163 may alleviate the high concentration of an electric field between the source/drain regions 161 having a high dopant concentration and the active fin F. Accordingly, this reduces the parasitic resistance of the semiconductor device, thus securing high current driving characteristics.

A method of fabricating a semiconductor device according to example embodiments of the present inventive concept will now be described with reference to FIGS. 7, 11 through 15, and 19 through 31. The current embodiments are substantially the same as the previous embodiment of FIGS. 11 through 28 except for a thickness of a liner layer. Therefore, elements substantially identical to those of the previous embodiment are indicated by like reference numerals, and thus a repetitive description thereof will be given briefly or omitted.

Figure 29:
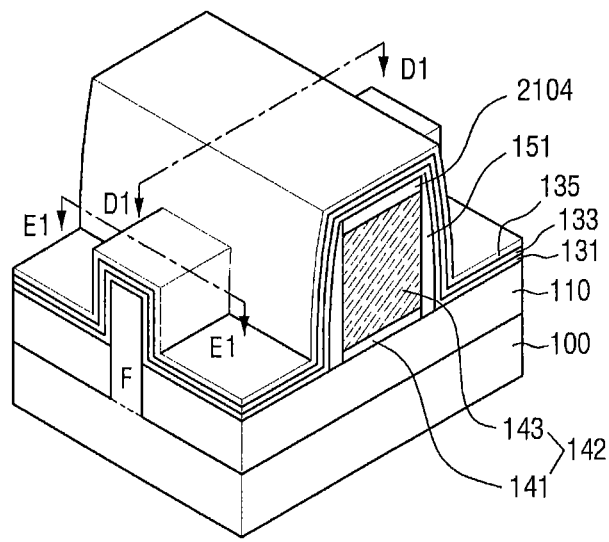
FIGS. 29 through 31 are views illustrating steps of a method of fabricating a semiconductor device according to example embodiments of the present inventive concept.
Figure 30:
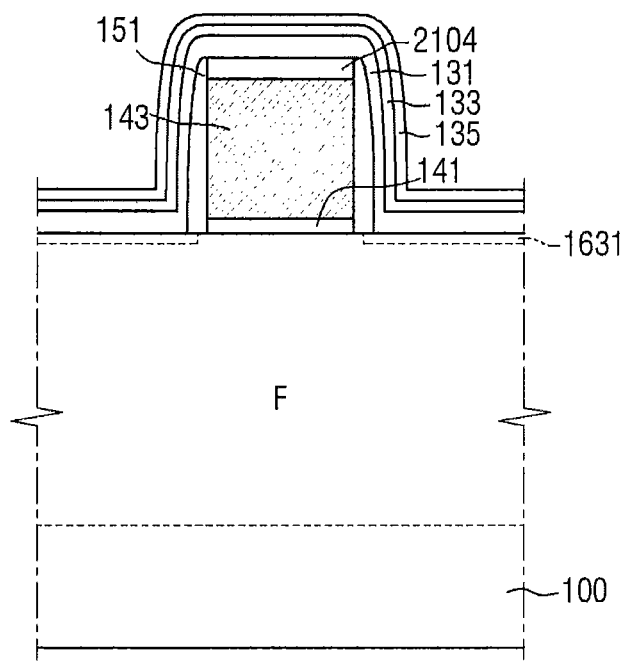
Figure 31:
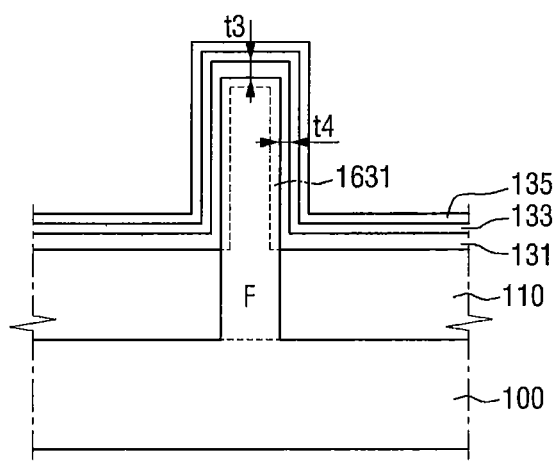

FIGS. 29 through 31 are views illustrating steps of a method of fabricating a semiconductor device according to example embodiments of the present inventive concept. FIG. 30 is a cross-sectional view taken along the line D1-D1 of FIG. 29. FIG. 31 is a cross-sectional view taken along the line E1-E1 of FIG. 29.

First, the processes of FIGS. 11 through 15 are performed.

Then, referring to FIGS. 29 through 31, a liner layer 131 and a dopant supply layer 133 may be formed sequentially on an exposed upper surface of an active fin F and exposed side surfaces of the active fin F which face each other. Further, the liner layer 131 and the dopant supply layer 133 may be formed on side surfaces of spacers 151. A byproduct layer 135 may further be formed on the dopant supply layer 133. A fourth thickness t4 of the liner layer 131 formed on the side surfaces of the spacers 151 and the side surfaces of the active fin F may be different from a third thickness t3 of the liner layer 131 formed on the upper surface of the active fin F. In the method of fabricating a semiconductor device according to the current embodiments, the third thickness t3 of the liner layer 131 may be greater than the fourth thickness t4 of the liner layer 131. The fourth thickness t4 of the liner layer 131 may be zero. That is, the liner layer 131 may be disposed only on the upper surface of the active fin F and a dummy gate pattern (141, 143), but the present inventive concept is not limited thereto.

After the formation of the liner layer 131, a PAI process may be performed to make a peripheral part of the upper surface of the active fin F amorphous. Then, the dopant supply layer 133 may be formed on the active fin F and the dummy gate pattern (141, 143). The method of forming the dopant supply layer 133 has been described above in detail with reference to FIGS. 16 through 18, and thus a description thereof is omitted.

Next, a first heat treatment process 1651 and a second heat treatment process 1653 are performed to form a doped region 163 along the periphery of the active fin F which does not overlap the dummy gate pattern (141, 143). After the formation of the doped region 163, source/drain regions 161 may be formed. Subsequent processes for fabricating a semiconductor device are as described above.

Figure 32:
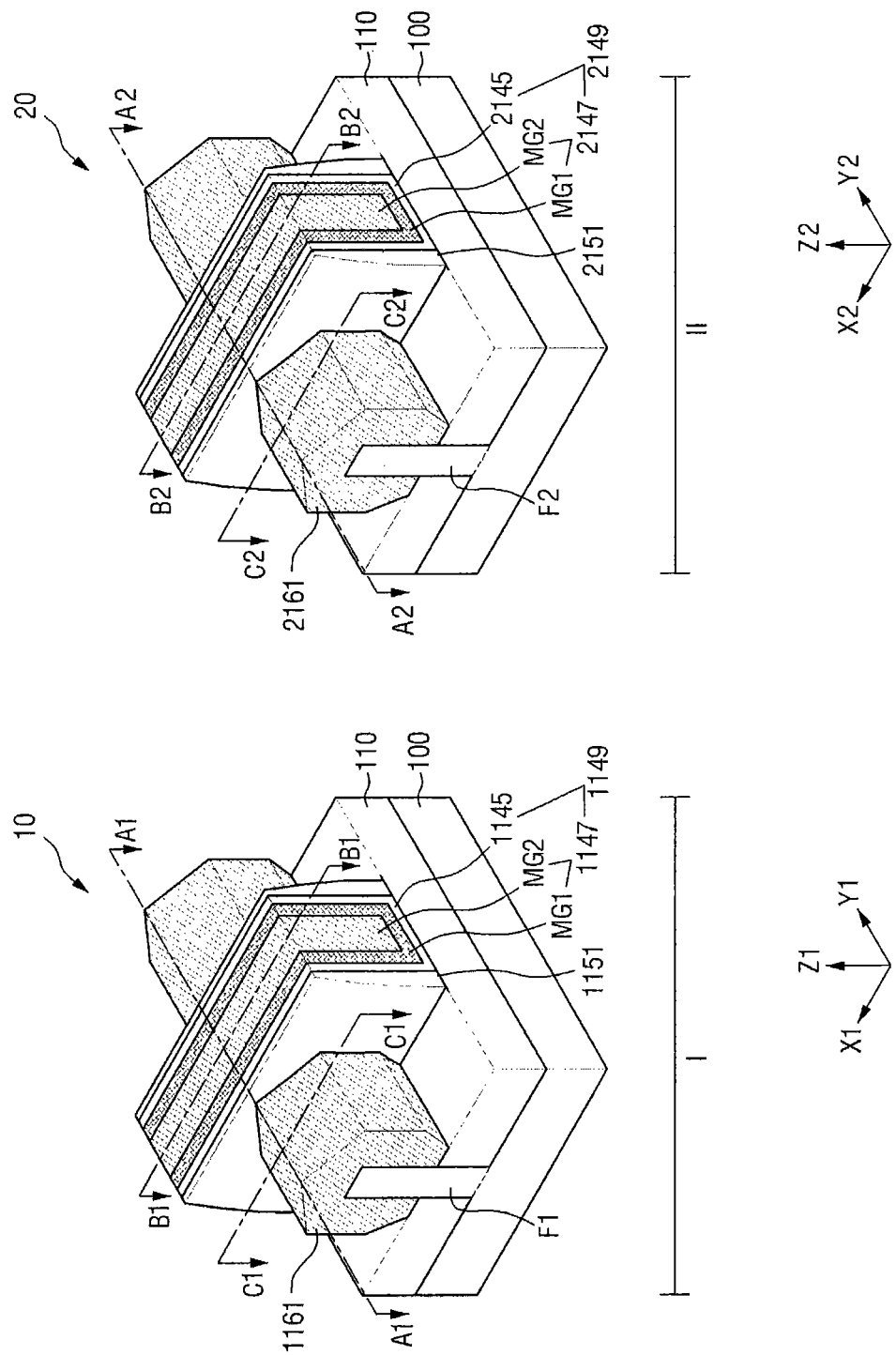
FIG. 32 is a perspective view of semiconductor devices according to example embodiments of the present inventive concept.
Figure 33:
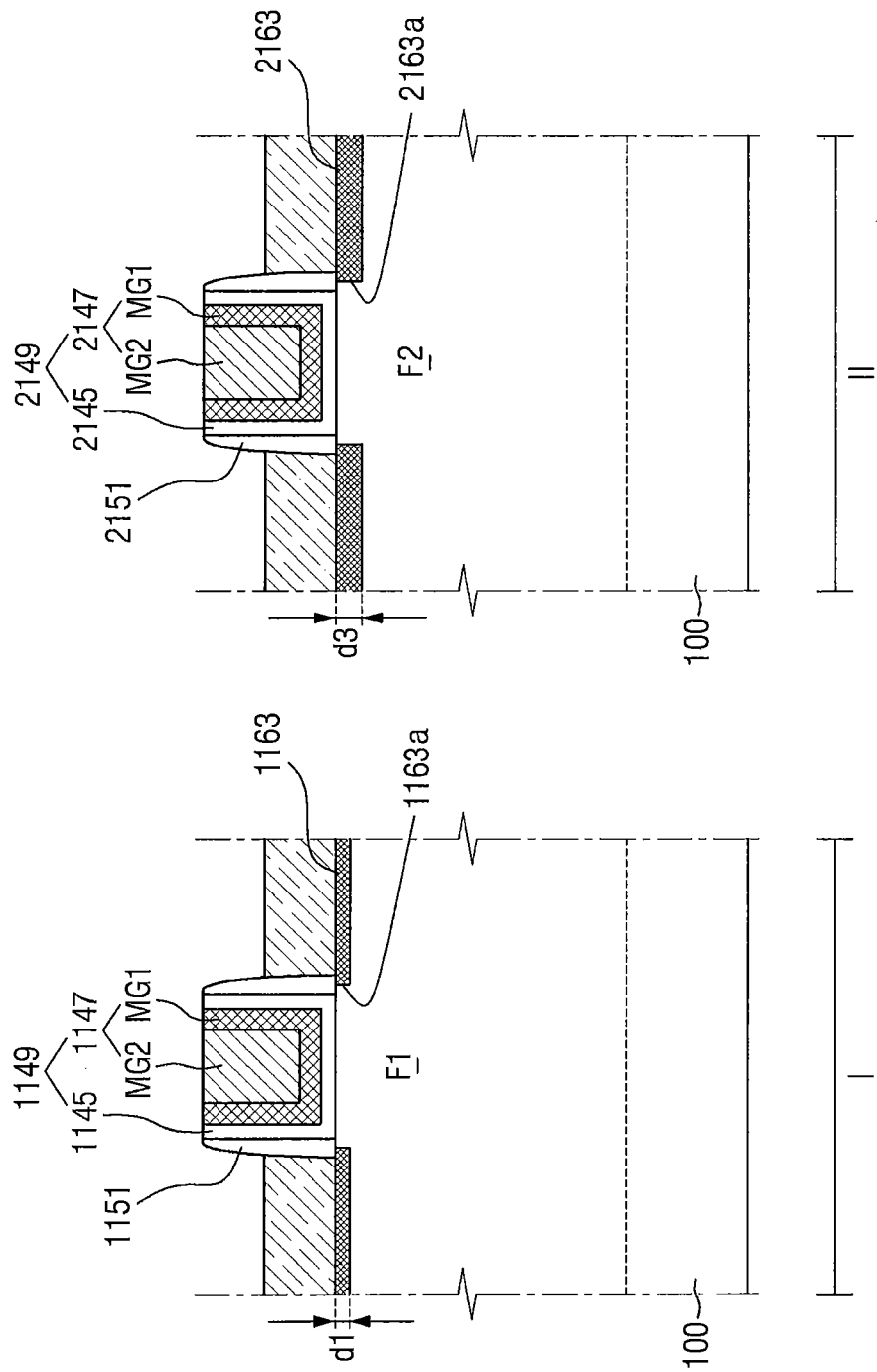
FIG. 33 is a cross-sectional view taken along the lines A1-A1 and A2-A2 of FIG. 32, respectively.
Figure 34:
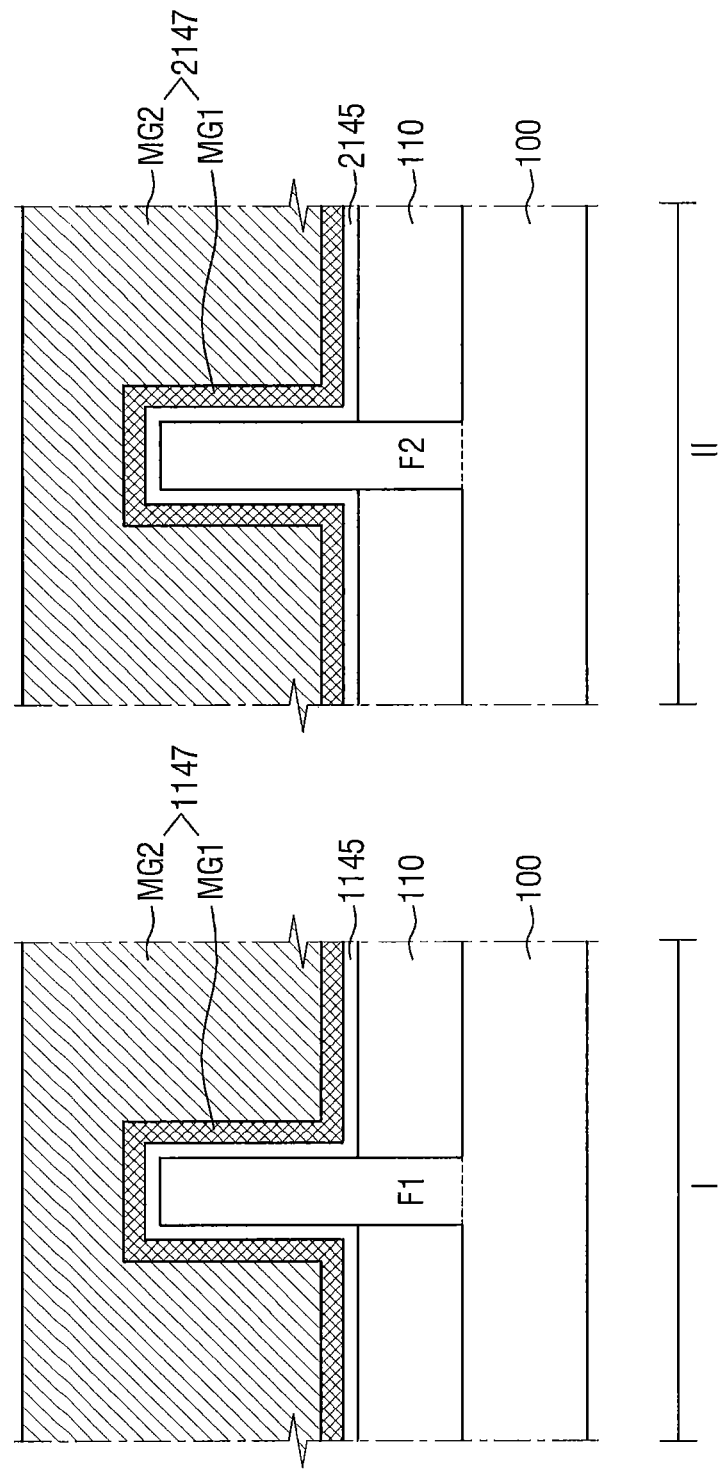
FIG. 34 is a cross-sectional view taken along the lines B1-B1 and B2-B2 of FIG. 32, respectively.
Figure 35:
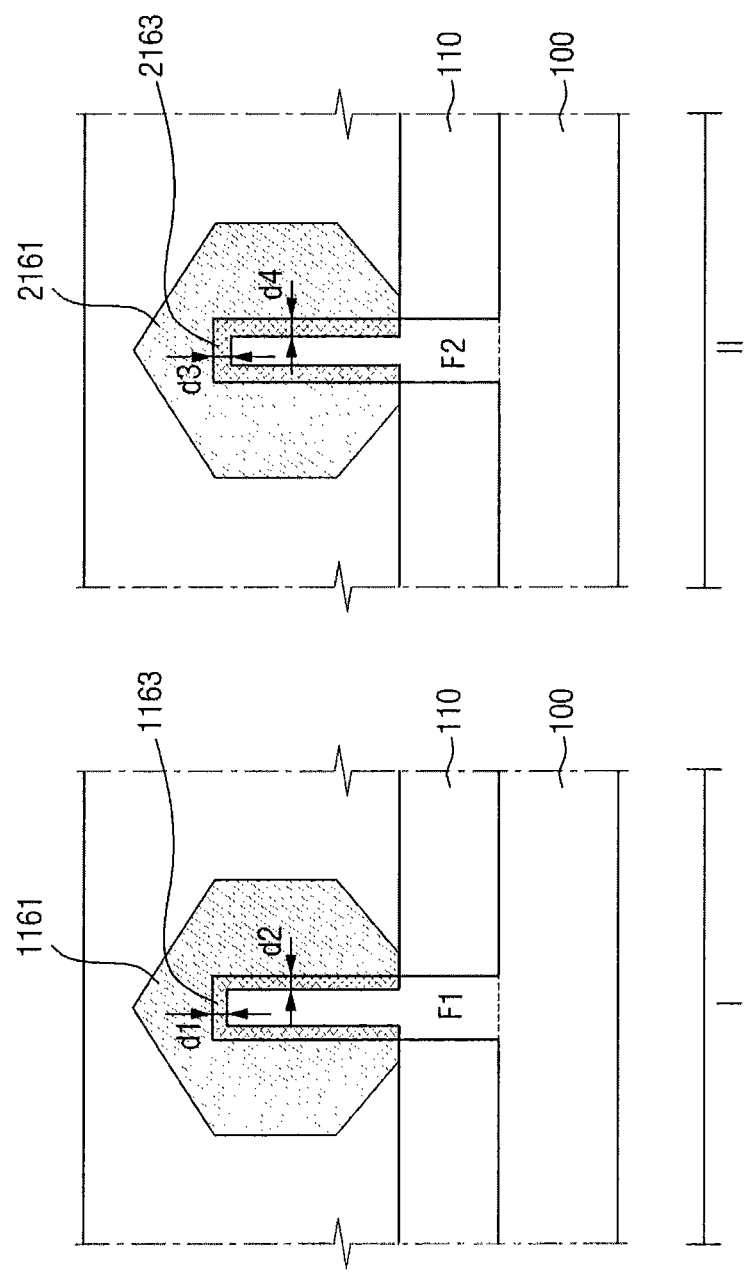
FIG. 35 is cross-sectional views taken along the lines C1-C1 and C2-C2 of FIG. 32, respectively.

FIGS. 32 through 35 are views of semiconductor devices according to example embodiments of the present inventive concept. FIG. 32 shows perspective views of semiconductor devices 10 and 20 according to embodiments of the present inventive concept. FIG. 33 shows cross-sectional views taken along the lines A1-A1 and A2-A2 of FIG. 32, respectively. FIG. 34 shows cross-sectional views taken along the lines B1-B1 and B2-B2 of FIG. 32, respectively. FIG. 35 shows cross-sectional views taken along the lines C1-C1 and C2-C2 of FIG. 32, respectively.

The current embodiments are substantially the same as the semiconductor device according to the previous embodiments of FIGS. 7 through 10, except that first and second doped regions 1163 and 2163 of the semiconductor devices 10 and 20 disposed in different areas of a substrate 100 have different thicknesses. Therefore, a repetitive description of elements substantially identical to those of the semiconductor device according to the previous embodiments will be omitted.

Referring to FIGS. 32 through 35, the substrate 100 includes a first area I and a second area II. The first area I and the second area II may include the first semiconductor device 10 and the second semiconductor device 20, respectively. The first semiconductor device 10 may be a first transistor, and the second semiconductor device 20 may be a second transistor. The first area I and the second area II may be connected to or separated from each other.

The first semiconductor device 10 may be disposed on the substrate 100 and include a first active fin F1, a first gate pattern 1149, first source/drain regions 1161, and first spacers 1151. The first gate pattern 1149 may include a first gate electrode 1147 and a first gate insulating layer 1145. The first gate electrode 1147 may include metal layers (MG1, MG2). In addition, the first active fin F1 may include the first doped region 1163. The second semiconductor device 20 may be disposed on the substrate 100 and include a second active fin F2, a second gate pattern 2149, second source/drain regions 2161, and second spacers 2151. The second gate pattern 2149 may include a second gate electrode 2147 and a second gate insulating layer 2145. The second gate electrode 2147 may include metal layers (MG1, MG2). In addition, the second active fin F2 may include the second doped region 2163.

The first gate pattern 1149, the second gate pattern 2149, the first source/drain regions 1161, the second source/drain regions 2161, the first spacers 1151, the second spacers 2151, the first gate electrode 1147, the second gate electrode 2147, the first gate insulating layer 1145, and the second gate insulating layer 2145 may be substantially the same as the gate pattern 119, the source/drain regions 161, the spacers 151, the gate electrode 147, and the gate insulating layer 145 of the semiconductor device according to the previous embodiment of the present inventive concept, respectively.

The first doped region 1163 and the second doped region 2163 respectively included in the first active fin F1 and the second active fin F2 may be substantially the same as the doped region 1163 included in the semiconductor device according to the previous embodiment of the present inventive concept. However, a first depth d1 and a second depth d2 of the first doped region 1163 may be different from a third depth d3 and a fourth depth d4 of the second doped region 2163, respectively.

Another region of the first-active fin F1 which does not contain a dopant contained in the first doped region 1163 may be referred to as a first undoped region, and another region of the second active fin F2 which does not contain a dopant contained in the second doped region 2163 may be referred to as a second undoped region. However, the present inventive concept is not limited thereto.

That is, in the first and second semiconductor devices 10 and 20, the first and second doped regions 1163 and 2163 disposed at locations corresponding to each other may have different depths. Specifically, the first depth d1 of the first doped region 1163 disposed on an upper surface of the first active fin F1 may be smaller than the third depth d3 of the second doped region 2163 disposed on the upper surface of the second active fin F2. The second depth d2 of the first doped region 1163 disposed on side surfaces of the first active fin F1 may be smaller than the fourth depth d4 of the second doped region 2163 disposed on side surfaces of the second active fin F2.

The first and second doped regions 1163 and 2163 may contain different dopants. For example, the first doped region 1163 may contain arsenic (As), and the second doped region 2163 may contain boron (B). However, the present inventive concept is not limited thereto. The first semiconductor device 10 may be, but is not limited to, a p-type transistor, and the second semiconductor device 20 may be, but is not limited to, an n-type transistor.

As in the previous embodiments of the present inventive concept, the first depth d1 and the second depth d2 of the first doped region 1163 may be equal or different, and the third depth d3 and the fourth depth d4 of the second doped region 2163 may be equal or different.

A semiconductor device according to example embodiments of the present inventive concept will now be described with reference to FIGS. 36 through 39.

Figure 36:
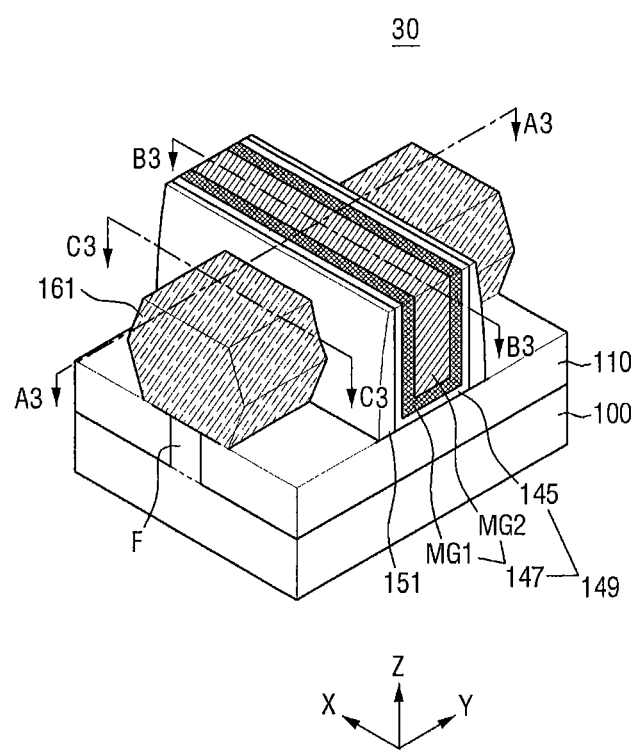
FIG. 36 is a perspective view of a semiconductor device 30 according to example embodiments of the present inventive concept.
Figure 37:
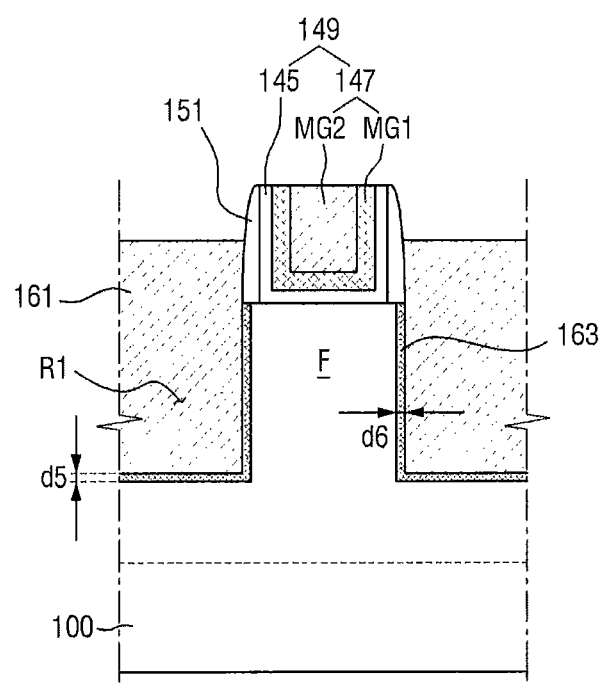
FIG. 37 is a cross-sectional view taken along the line A3-A3 of FIG. 36.
Figure 38:
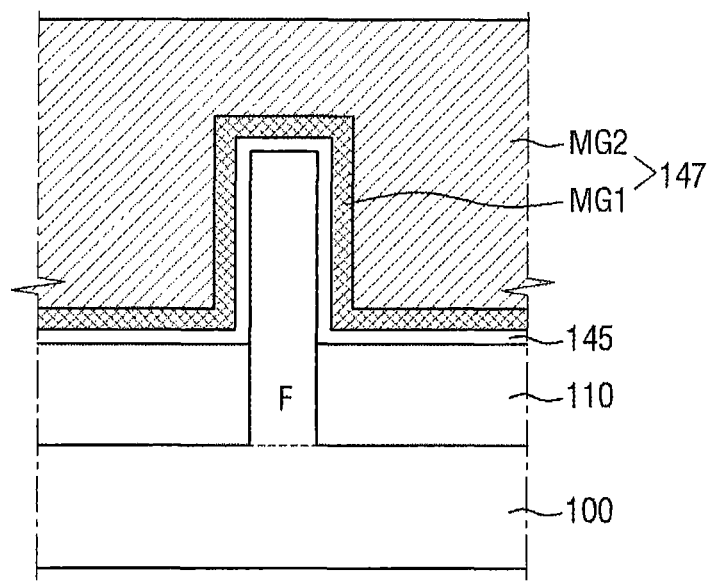
FIG. 38 is a cross-sectional view taken along the line B3-B3 of FIG. 36.
Figure 39:
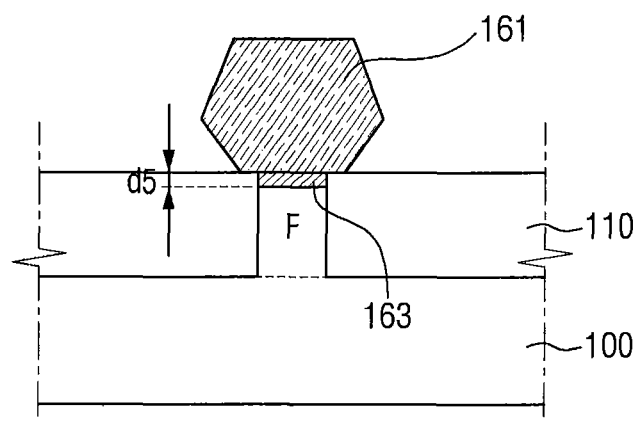
FIG. 39 is a cross-sectional view taken along the line C3-C3 of FIG. 36.

FIG. 36 is a perspective view of a semiconductor device 30 according to example embodiments of the present inventive concept. FIG. 37 is a cross-sectional view taken along the line A3-A3 of FIG. 36. FIG. 38 is a cross-sectional view taken along the line B3-B3 of FIG. 36. FIG. 39 is a cross-sectional view taken along the line C3-C3 of FIG. 36. The current embodiments are substantially the same as the semiconductor device according to the previous embodiments of FIGS. 7 through 10 except for a recess R1 formed in an active fin F. Therefore, elements substantially identical to those of the previous embodiments are indicated by like reference numerals, and thus a repetitive description thereof will be given briefly or omitted.

Referring to FIGS. 36 through 39, the semiconductor device 30 may be disposed on a substrate 100 and include the active fin F, a gate pattern 149, source/drain regions 161 and spacers 151. The gate pattern 149 may include a gate electrode 147 and a gate insulating layer 145. The gate electrode 147 may include metal layers (MG1, MG2). In addition, the active fin F may include a doped region 163. In the semiconductor device 30, a recess R1 may be formed in the active fin F, and the source/drain regions 161 may be formed on the recess R1. This will be described later.

Referring to FIG. 37, the source/drain regions 161 are disposed on both sides of the gate pattern 149. The source/drain regions 161 are formed on the active fin F exposed by a field insulating layer 110. The source/drain regions 161 may be elevated source/drain regions. That is, upper surfaces of the source/drain regions 161 may be higher than that of the field insulating layer 110. In addition, the source/drain regions 161 may be insulated from the gate pattern 149 by the spacers 151. In addition, the doped region 163 may lie in the same plane with side surfaces of the spacers 151. That is, the doped region 163 may be formed in the active fin F along a bottom surface and sidewalls of the recess R1. Since the sidewalls of the recess R1 may lie in the same plane with the side surfaces of the spacers 151, the doped region 163 may also lie in the same plane with the side surfaces of the spacers 151.

The doped region 163 may be formed evenly on the sidewalls and bottom surface of the recess R1. The doped region 163 formed on the bottom surface of the recess R1 may have a fifth depth d5 in the active fin F. The doped region 163 formed on the sidewalls of the recess R1 may have a sixth depth d6 in the active fin F. The fifth depth d5 and the sixth depth d6 may be equal or different. When the fifth depth d5 and the sixth depth d6 are different, the fifth depth d5 may be, but is not limited to, greater than the sixth depth d6.

Referring to FIG. 38, the field insulating layer 110 is formed on a lower part of the active fin F formed on the substrate 100. The gate insulating layer 145 is formed on the active fin F which protrudes further upward than the field insulating layer 110, and the gate electrode 147 including a first metal layer MG1 and a second metal layer MG2 is formed on the gate insulating layer 145. In FIG. 32, the doped region 163 is not formed on the active fin F which intersects the gate insulating layer 145.

Referring to FIG. 39, the source/drain regions 161 may be formed on an upper surface of the active fin F. Specifically, the doped region 163 may be formed to the fifth depth d5 on the upper surface of the active fin F, and the source/drain regions 161 which contact the doped region 163 may be formed on the upper surface of the active fin F. The upper surface of the active fin F and the upper surface of the field insulating layer 110 may lie in the same plane. In FIG. 39, each of the source/drain regions 161 is hexagonal. However, the shape of each of the source/drain regions 161 is not limited to the hexagonal shape. That is, each of the source/drain regions 161 can have a diamond shape, a circular shape, a rectangular shape, or a pentagonal shape.

A method of fabricating a semiconductor device according to example embodiments of the present inventive concept will now be described with reference to FIGS. 11 through 15, 36, and 40 through 53.

Figure 42:
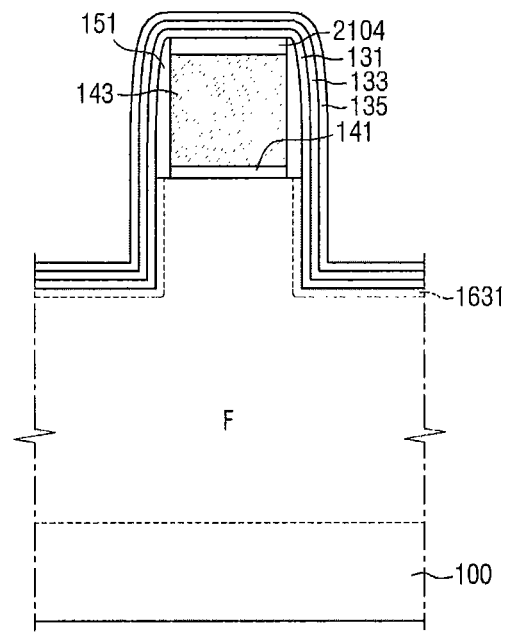
Figure 43:
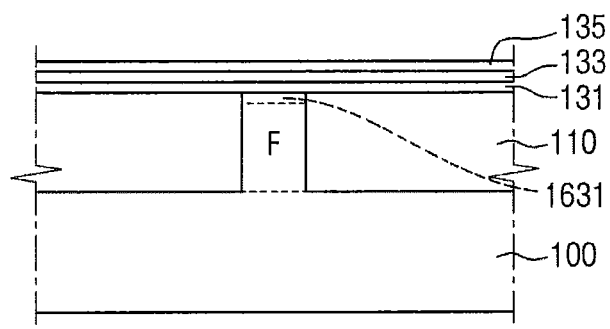
Figure 44:
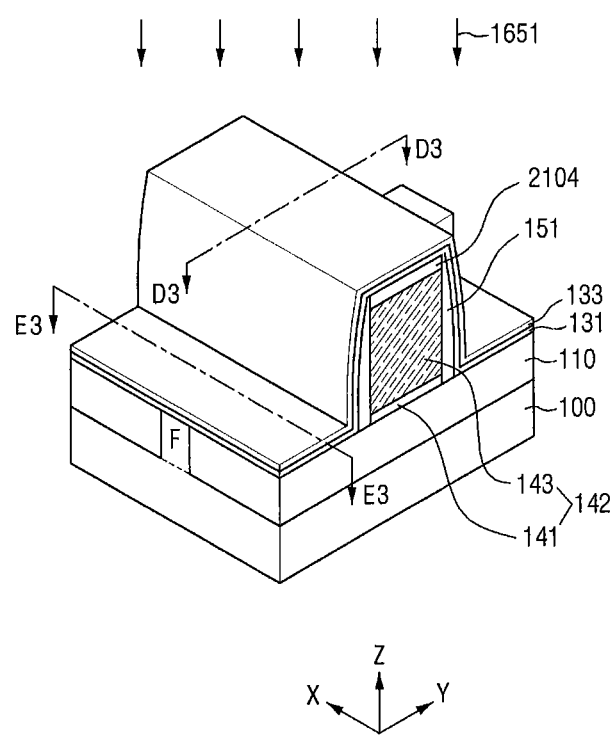
Figure 45:
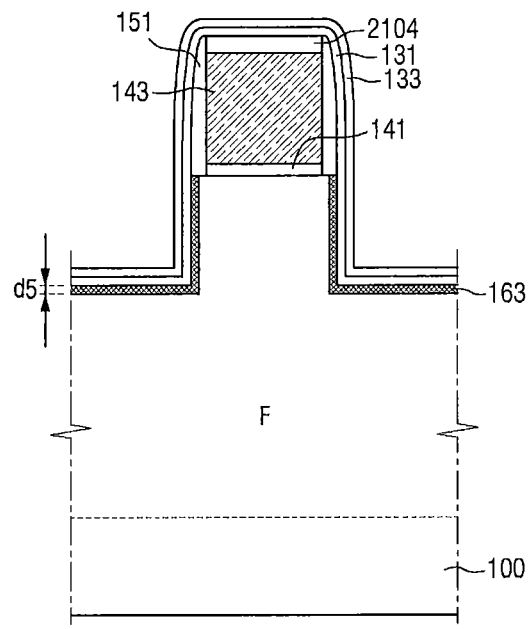
Figure 46:
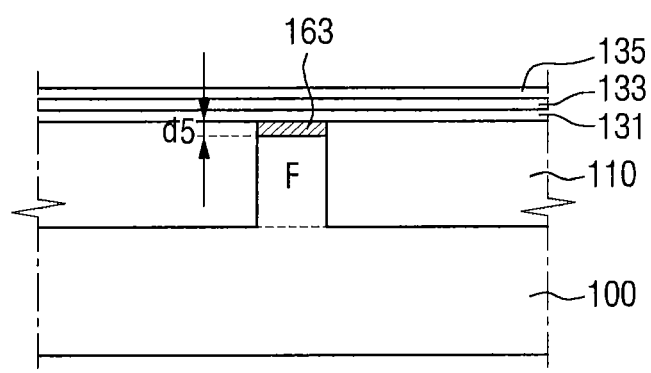
Figure 47:
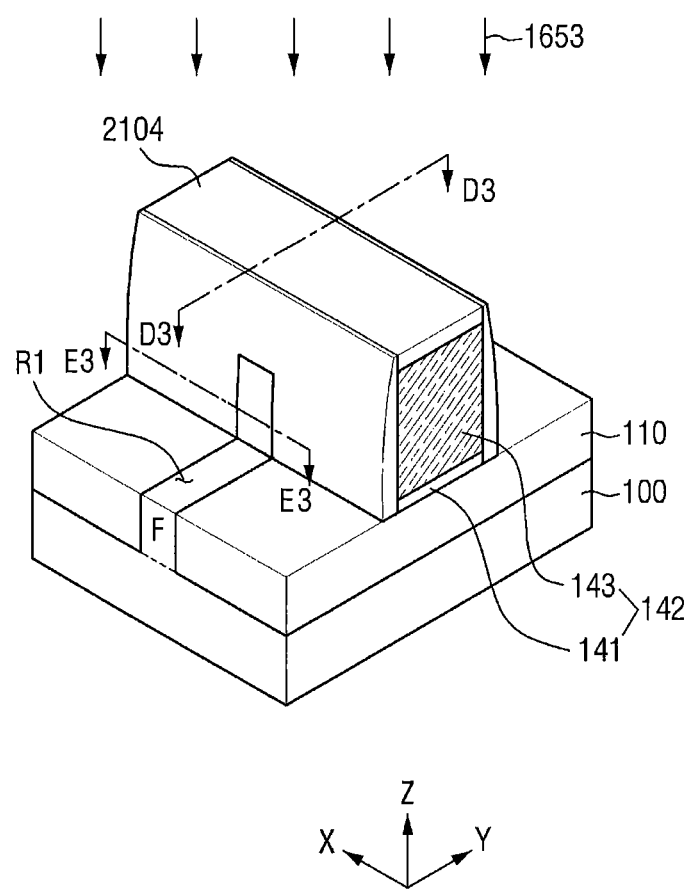
Figure 48:
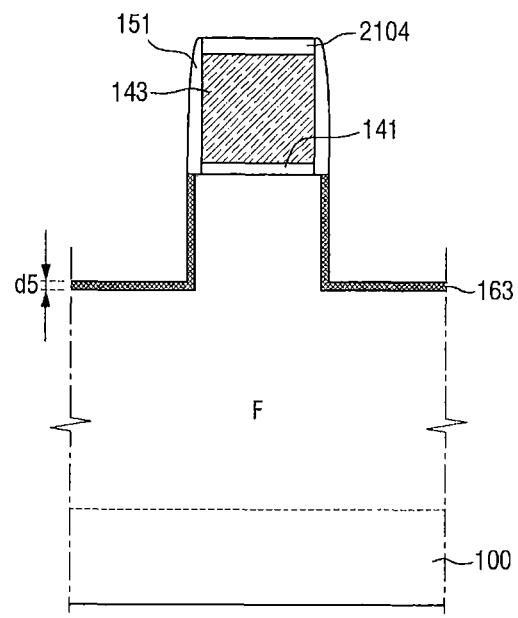
Figure 49:
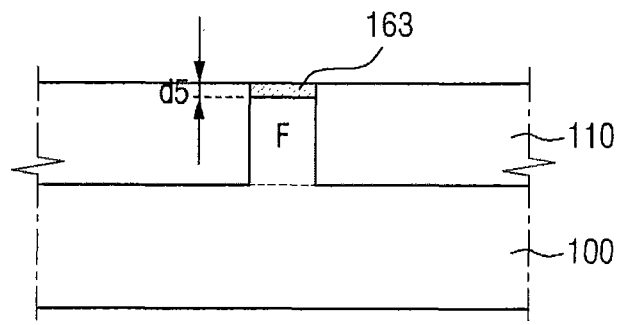

FIGS. 40 through 53 are views illustrating steps of a method of fabricating a semiconductor device according to example embodiments of the present inventive concept. FIG. 42 is a cross-sectional view taken along the line D3-D3 of FIG. 41. FIG. 42 is a cross-sectional view taken along the line E3-E3 of FIG. 41. FIG. 45 is a cross-sectional view taken along the line D3-D3 of FIG. 44. FIG. 46 is a cross-sectional view taken along the line E3-E3 of FIG. 44. FIG. 48 is a cross-sectional view taken along the line D3-D3 of FIG. 47. FIG. 49 is a cross-sectional view taken along the line E3-E3 of FIG. 47. The method of fabricating a semiconductor device according to the current embodiments is substantially the same as the method of fabricating a semiconductor device according to the previous embodiment of FIGS. 11 through 28 except that a recess R1 is formed. Therefore, elements substantially identical to those of the previous embodiment are indicated by like reference numerals, and thus a repetitive description thereof will be given briefly or omitted.

First, the processes of FIGS. 11 through 15 are performed, thereby forming spacers 151.

Figure 40:
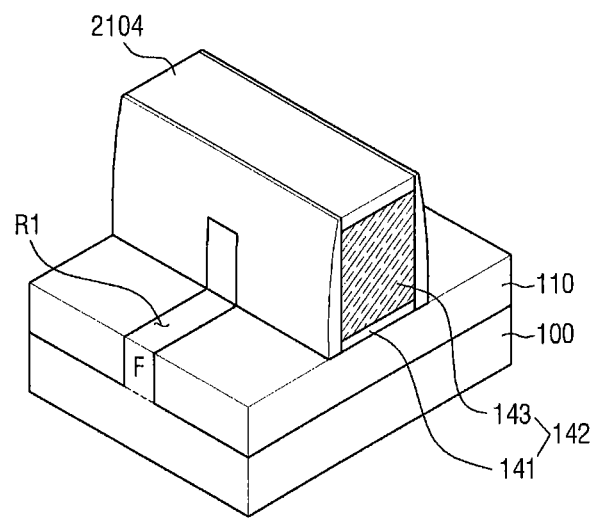
FIGS. 40 through 53 are views illustrating steps of fabricating a semiconductor device according to example embodiments of the present inventive concept.
Figure 41:
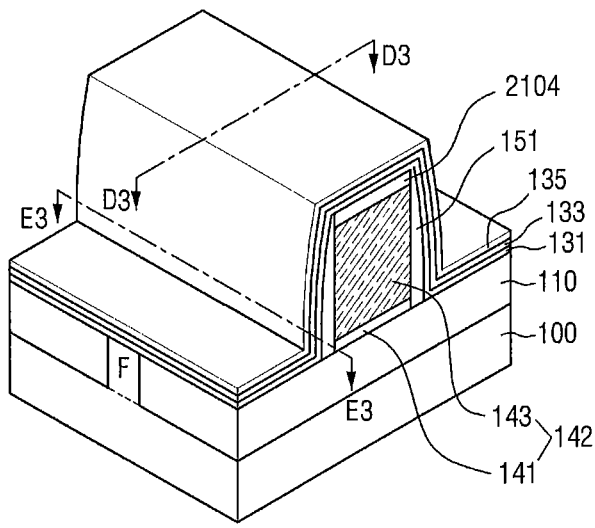

Then, referring to FIG. 40, the recess R1 is formed by partially removing an active fin F exposed on both sides of a dummy gate pattern 142 and the spacers 151. In the drawing, an upper surface of the active fin F exposed by a field insulating layer 110 may lie in the same plane with an upper surface of the field insulating layer 110. However, the present inventive concept is not limited thereto. That is, the upper surface of the active fin F exposed by the field insulating layer 110 can also be recessed further toward a substrate 100 than the upper surface of the field insulating layer 110. The partially removing of the active fin F exposed on both sides of the spacers 151 may expose side surfaces of the active fin F on side surfaces of the spacers 151.

Referring to FIGS. 41 through 46, a liner layer 131 and a dopant supply layer 133 are formed sequentially on an upper surface of the recess R1 of the active fin F. That is, the liner layer 131 and the dopant supply layer 133 may be formed on a bottom surface and sidewalls of the recess R1 of the active fin F. A byproduct layer 135 may further be formed on the dopant supply layer 133. In addition, a doped region 163 may be formed in the active fin F. These processes may be substantially identical to the processes of FIGS. 16 through 21 described above, and thus a repetitive description thereof is omitted. However, in the current embodiments, the doped region 163 may be formed in the active fin F along the bottom surface and sidewalls of the recess R1 of the active fin F.

Figure 50:
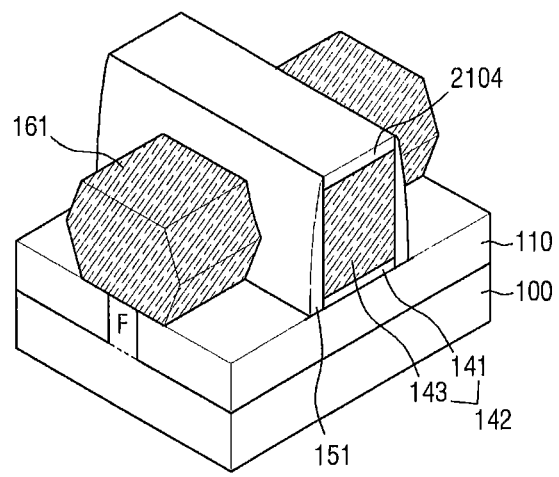

Referring to FIG. 50, source/drain regions 161 are formed on the active fin F disposed on both sides of the dummy gate pattern 142 and the spacers 151. The source/drain regions 161 may be formed by an epitaxial process. The material of the source/drain regions 161 may vary depending on whether a semiconductor device according to an embodiment of the present inventive concept is an n-type transistor or a p-type transistor. In addition, if necessary, a dopant may be used to in-situ-dope the source/drain regions 161 in the epitaxial process. Each of the source/drain regions 161 is polygonal in the drawing. However, the shape of each of the source/drain regions 161 is not limited to the polygonal shape.

Figure 51:
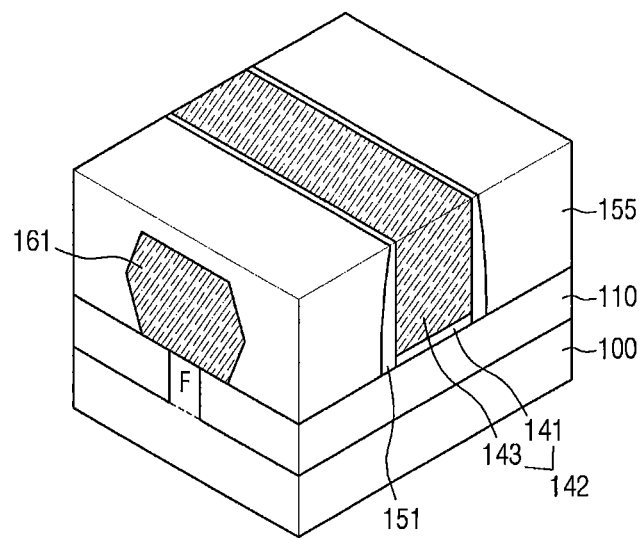
Figure 52:
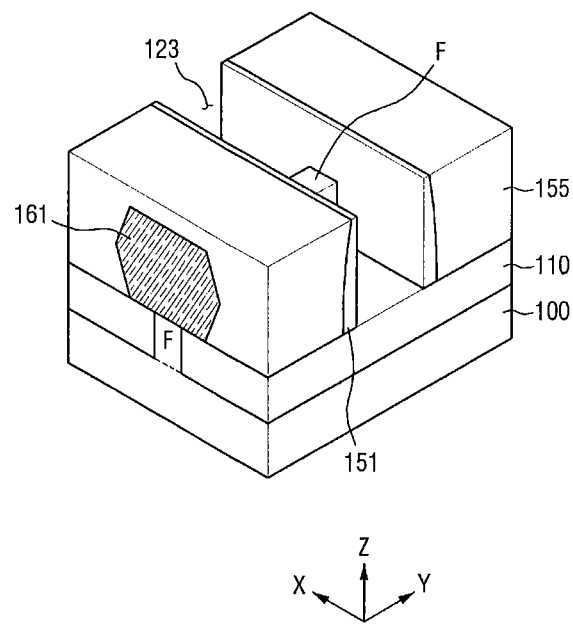
Figure 53:
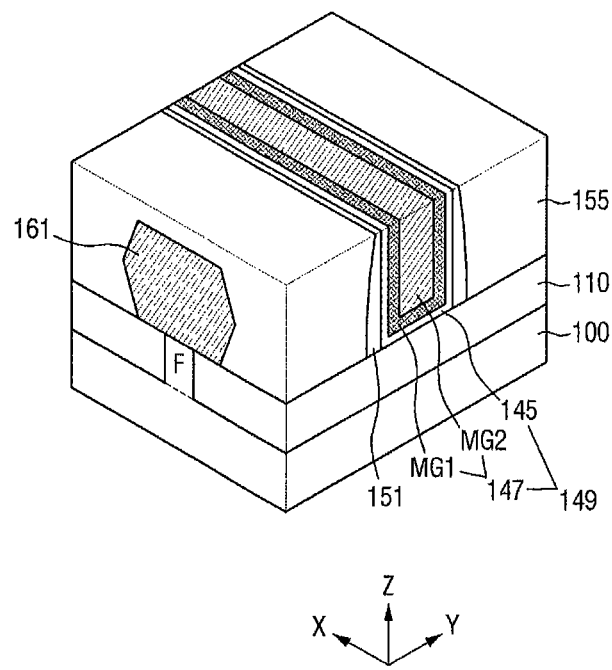

Referring to FIG. 51, an interlayer insulating film 155 is formed on the resultant structure having the source/drain regions 161. The interlayer insulating film 155 may include at least one of an oxide layer, a nitride layer, and an oxynitride layer. Then, the interlayer insulting film 155 is planarized until an upper surface of the dummy gate pattern 142 is exposed. As a result, a mask pattern 2104 is removed, and the upper surface of the dummy gate pattern 142 is exposed. Referring to FIG. 52, the dummy gate pattern 142, that is, a dummy gate insulating layer 141 and a dummy gate electrode 143 are removed. The removal of the dummy gate insulating layer 141 and the dummy gate electrode 143 results in the formation of a trench 123 which exposes the field insulating layer 110 and part of the active fin F. Referring to FIG. 53, a gate insulating layer 145 and a gate electrode 147 are formed in the trench 123, thereby forming a gate pattern 149. The gate electrode 147 may include metal layers (MG1, MG2).

Semiconductor devices according to example embodiments of the present inventive concept will now be described with reference to FIGS. 54 through 57.

Figure 54:
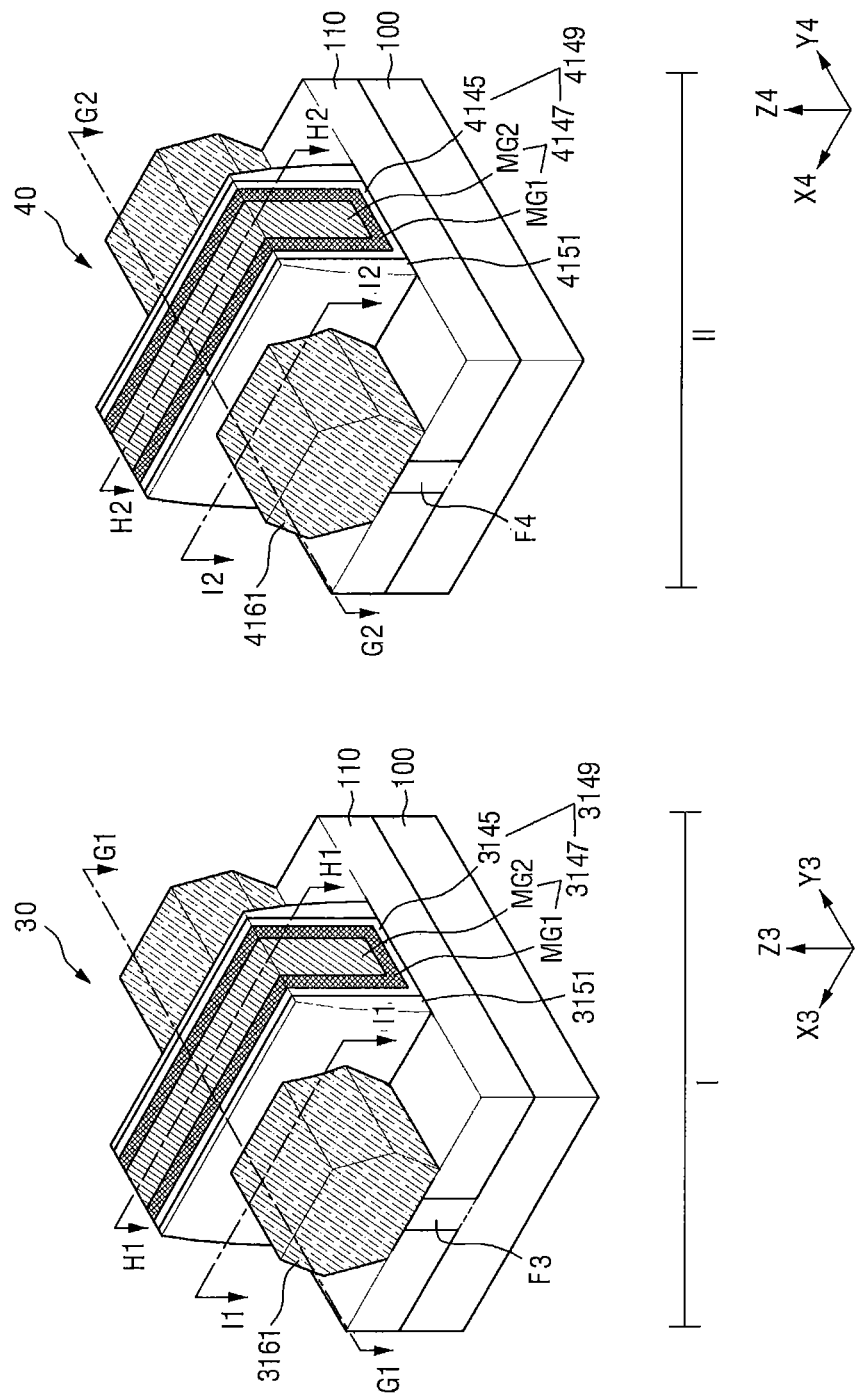
FIG. 54 shows perspective views of semiconductor devices 30 and 40 according to example embodiments of the present inventive concept.
Figure 55:
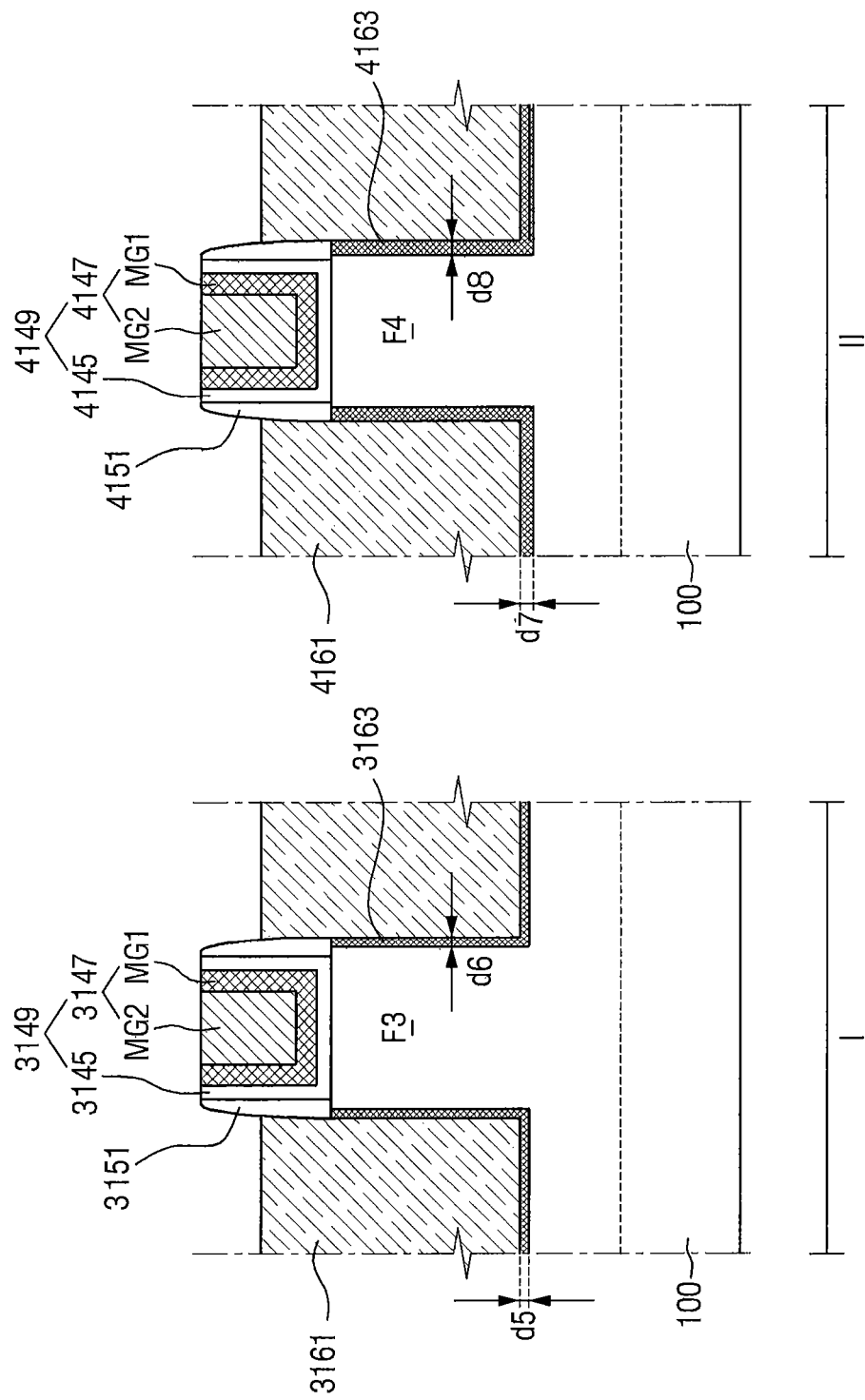
FIG. 55 shows cross-sectional views taken along the lines G1-G1 and G2-G2 of FIG. 54, respectively.
Figure 56:
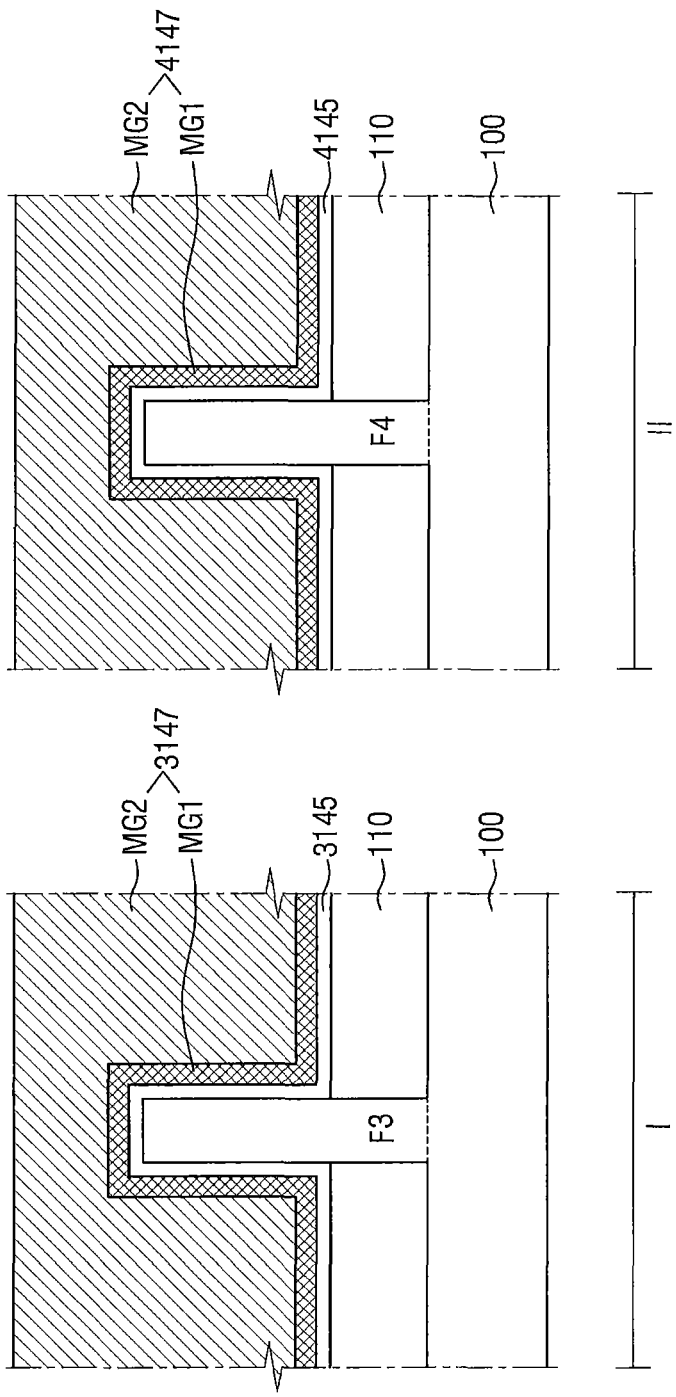
FIG. 56 shows cross-sectional views taken along the lines H1-H1 and H2-H2 of FIG. 54, respectively.
Figure 57:
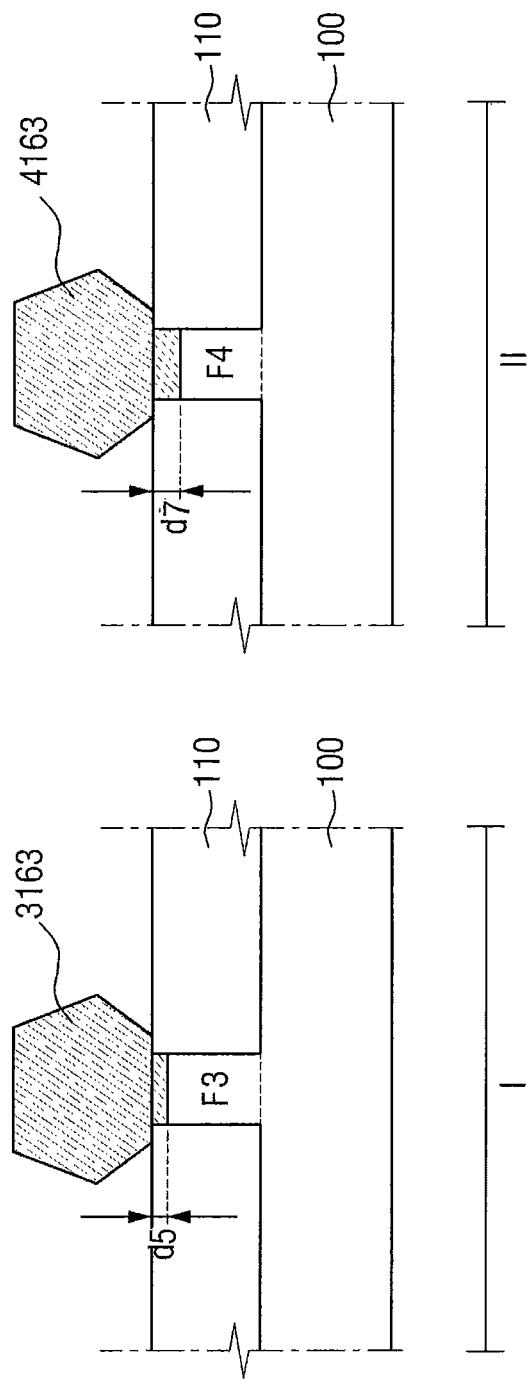
FIG. 57 shows cross-sectional views taken along the lines I1-I1 and I2-I2 of FIG. 54, respectively.

FIG. 54 shows perspective views of semiconductor devices 30 and 40 according to the example embodiments of the present inventive concept. FIG. 55 shows cross-sectional views taken along the lines G1-G1 and G2-G2 of FIG. 54, respectively. FIG. 56 shows cross-sectional views taken along the lines H1-H1 and H2-H2 of FIG. 54, respectively. FIG. 57 shows cross-sectional views taken along the lines I1-I1 and I2-I2 of FIG. 54, respectively. The semiconductor devices 30 and 40 disposed in different areas of a substrate 100 according to the current embodiments are substantially the same as the semiconductor device 30 according to the previous embodiments of FIGS. 36 through 39, except that they include third and fourth doped regions 3163 and 4163 having different depths. Therefore, a repetitive description of elements substantially identical to those of the previous embodiments will be omitted.

Referring to FIGS. 54 through 57, the substrate 100 includes a first area I and a second area II. The first area I and the second area II may include the third semiconductor device 30 and the fourth semiconductor device 40, respectively. The third semiconductor device 30 may be a first transistor, and the fourth semiconductor device 40 may be a second transistor. The first area I and the second area II may be connected to or separated from each other.

The third semiconductor device 30 may be disposed on the substrate 100 and include a third active fin F3, a third gate pattern 3149, third source/drain regions 3161, and third spacers 3151. The third gate pattern 3149 may include a third gate electrode 3147 and a third gate insulating layer 3145. The third gate electrode 3147 may include metal layers (MG1, MG2). In addition, the third active fin F3 may include the third doped region 3163. The fourth semiconductor device 40 may be disposed on the substrate 100 and include a fourth active fin F4, a fourth gate pattern 4149, fourth source/drain regions 4161, and fourth spacers 4151. The fourth gate pattern 4149 may include a fourth gate electrode 4147 and a fourth gate insulating layer 4145. The fourth gate electrode 4147 may include metal layers (MG1, MG2). In addition, the fourth active fin F4 may include the fourth doped region 4163.

The third gate pattern 3149, the fourth gate pattern 4149, the third source/drain regions 3161, the fourth source/drain regions 4161, the third spacers 3151, the fourth spacers 4151, the third gate electrode 3147, the fourth gate electrode 4147, the third gate insulating layer 3145, and the fourth gate insulating layer 4145 may be substantially the same as the gate pattern 119, the source/drain regions 161, the spacers 151, the gate electrode 147, and the gate insulating layer 145 of the semiconductor device according to the previous embodiment of the present inventive concept, respectively. The third doped region 3163 and the fourth doped region 4163 respectively included in the third active fin F3 and the fourth active fin F4 may be substantially the same as the doped region 1163 included in the semiconductor device according to the previous embodiment of the present inventive concept. However, a fifth depth d5 and a sixth depth d6 of the third doped region 3163 may be different from a seventh depth d7 and an eighth depth d8 of the fourth doped region 4163, respectively.

That is, in the third and fourth semiconductor devices 30 and 40, the third and fourth doped regions 3163 and 4163 disposed at corresponding locations may have different depths. Specifically, the fifth depth d5 of the third doped region 3163 disposed on an upper surface of the third active fin F3 may be smaller than the seventh depth d7 of the fourth doped region 4163 disposed on an upper surface of the fourth active fin F4. The sixth depth d6 of the third doped region 3163 disposed on side surfaces of the third active fin F3 may be smaller than the eighth depth d8 of the fourth doped region 4163 disposed on side surfaces of the fourth active fin F4. As in the previous embodiments of the present inventive concept, the fifth depth d5 and the sixth depth d6 of the third doped region 3163 may be equal or different, and the seventh depth d7 and the eighth depth d8 of the second doped region 2163 may be equal or different.

The third and fourth doped regions 3163 and 4163 may contain different dopants. For example, the third doped region 3163 may contain arsenic (As), and the fourth doped region 4163 may contain boron (B). However, the present inventive concept is not limited thereto. The third semiconductor device 30 may be, but is not limited to, a p-type transistor, and the fourth semiconductor device 40 may be, but is not limited to, an n-type transistor.

Another region of the third active fin F3 which does not contain a dopant contained in the third doped region 3163 may be referred to as a third undoped region, and another region of the fourth active fin F4 which does not contain a dopant contained in the fourth doped region 4163 may be referred to as a fourth undoped region. However, the present inventive concept is not limited thereto.

Thus, as described hereinabove with respect to at least FIG. 55, a CMOS integrated circuit can include an aligned (e.g., collinear) combination of an N-type FinFET (right side, II) and a P-type FinFET (left side, I). The N-type FinFET includes a first fin-shaped semiconductor active region F4 having a first insulated gate electrode 4149, 4151 thereon and first source and drain regions 4161 of first conductivity type (e.g., N-type) extending adjacent source-side and drain-side ends (e.g., vertical sidewalls) of the first fin-shaped semiconductor active region F4, respectively. A first doped semiconductor region 4163 of second conductivity type (e.g., P-type) is provided, which extends between at least a portion of the first source region 4161 and the source-side end of the first fin-shaped semiconductor active region F4. In addition, the P-type FinFET includes a second fin-shaped semiconductor active region F3, which is aligned to be collinear with the first fin-shaped semiconductor active region F4 and has a second insulated gate electrode 3149, 3151 thereon. Second source and drain regions 3161 of second conductivity type are provided, which extend adjacent source-side and drain-side ends of the second fin-shaped semiconductor active region F3, respectively. A second doped semiconductor region 3163 of first conductivity type is provided, which extends between at least a portion of the second source region 3161 and the source-side end of the second fin-shaped semiconductor active region F3.

As shown, the first and second doped semiconductor regions (4163, 3163) within the CMOS integrated circuit have unequal thicknesses (e.g., d6<d8 and d5<d7). As shown, the first doped semiconductor region 4163 of the N-type FinFET may be thicker than the second doped semiconductor region 3163 of the P-type FinFET. As previously described, the first doped semiconductor region 4163 may be doped with boron (B) and the second doped semiconductor region 3163 may be doped with arsenic (As). The first doped semiconductor region 4163 is illustrated as having an L-shape when viewed in a direction parallel to a lengthwise direction of the first insulated gate electrode 4149, 4151 and the second doped semiconductor region 3163 is illustrated as having an L-shape when viewed in a direction parallel to a lengthwise direction of the second insulated gate electrode 3149, 3151.

A semiconductor device according to example embodiments of the present inventive concept will now be described with reference to FIGS. 58 through 61.

Figure 58:
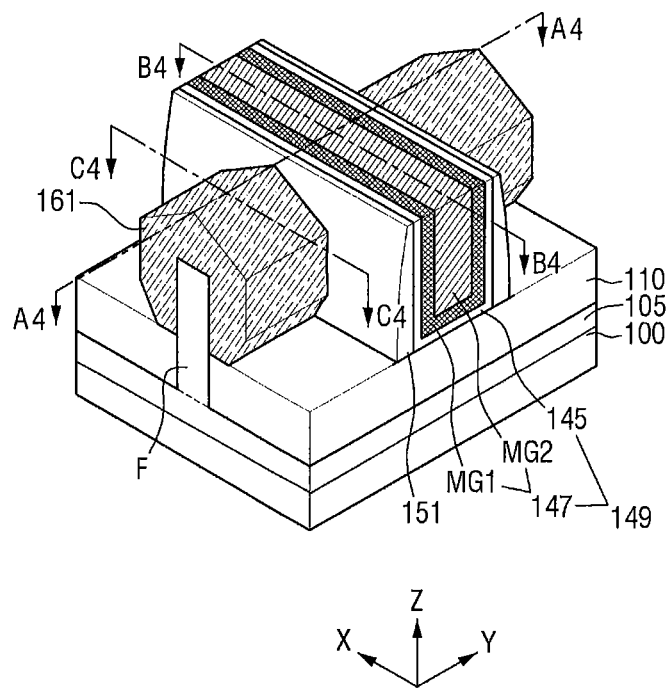
FIG. 58 is a perspective view of a semiconductor device according to example embodiments of the present inventive concept.
Figure 59:
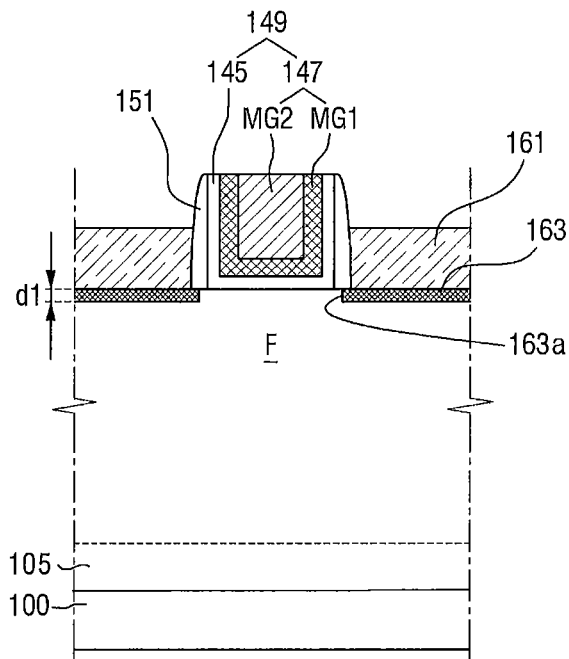
FIG. 59 is a cross-sectional view taken along the line A4-A4 of FIG. 58.
Figure 60:
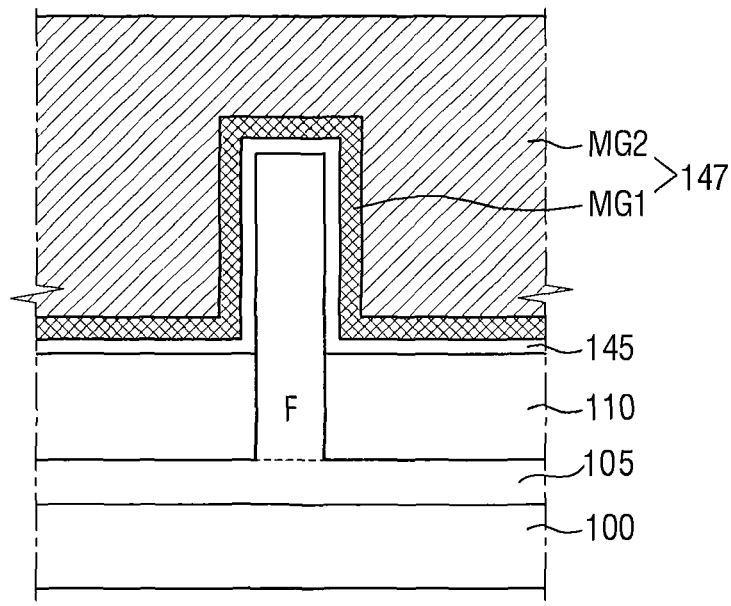
FIG. 60 is a cross-sectional view taken along the line B4-B4 of FIG. 58.
Figure 61:
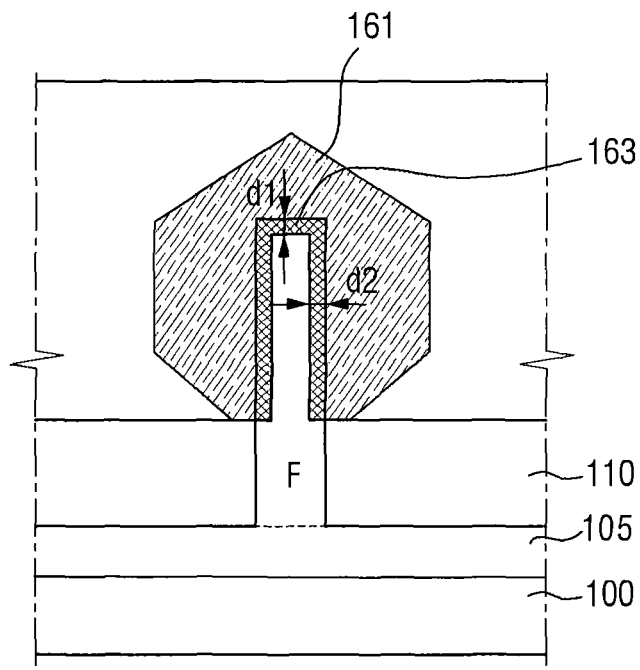
FIG. 61 is a cross-sectional view taken along the line C4-C4 of FIG. 58.

FIG. 58 is a perspective view of a semiconductor device according to the example embodiments of the present inventive concept. FIG. 59 is a cross-sectional view taken along the line A4-A4 of FIG. 58. FIG. 60 is a cross-sectional view taken along the line B4-B4 of FIG. 58. FIG. 61 is a cross-sectional view taken along the line C4-C4 of FIG. 58.

The semiconductor device according to the current embodiments is substantially the same as the semiconductor device according to the previous embodiments of FIGS. 7 through 10 except that it includes a strain relaxation layer 105. Therefore, elements substantially identical to those of the previous embodiments are indicated by like reference numerals, and thus a repetitive description thereof will be given briefly or omitted.

The strain relaxation layer 105 may be formed on a substrate 100. The strain relaxation layer 105 may contain a compound semiconductor. That is, the strain relaxation layer 105 may be a compound semiconductor layer. The strain relaxation layer 105 may include, for example, a group IV-IV compound semiconductor or a group III-V compound semiconductor. Specifically, the group IV-IV compound semiconductor may be, for example, a binary or ternary compound (such as silicon germanium) containing two or more of carbon (C), silicon (Si), germanium (Ge) and tin (Sn) or a compound obtained by doping the binary or ternary compound with a group IV element.

The group III-V compound semiconductor that forms the strain relaxation layer 105 may be, for example, a binary, ternary, or quaternary compound composed of at least one of aluminum (Al), gallium (Ga) and indium (In) (i.e., group III elements) bonded with one of phosphorus (P) and arsenic (As) (i.e., group V elements). The strain relaxation layer 105 may be formed on the substrate 100 using an epitaxial growth method. For example, the strain relaxation layer 105 may be formed by, but not limited to, atmospheric pressure chemical vapor deposition (APCVD), low (or reduced) pressure chemical vapor deposition (LPCVD), ultra-high vacuum chemical vapor deposition (UHV-CVD), molecular beam epitaxy (MBE), or metal organic chemical vapor deposition (MOCVD).

The strain relaxation layer 105 may have a similar crystal structure to the substrate 100. In the semiconductor device according to the current embodiments of the present inventive concept, a silicon substrate used as the substrate 100 has a diamond crystal structure. Therefore, the strain relaxation layer 105 that contains a compound semiconductor may have a zinc-blende structure similar to the diamond crystal structure. The strain relaxation layer 105 may be a single layer or include multiple layers. In addition, the strain relaxation layer 105 may include multiple layers whose lattice constants change as the distance from the substrate 100 increases. A field insulating layer 110 may be formed on the strain relaxation layer 105.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A method of fabricating a semiconductor device, the method comprising:
   forming an active fin extending along a first direction;
   forming a field insulating layer exposing an upper part of the active fin, along long sides of the active fin;
   forming a dummy gate pattern extending along a second direction intersecting the first direction, on the active fin;
   forming a spacer on at least one side of the dummy gate pattern;
   forming a liner layer covering the active fin exposed by the spacer and the dummy gate pattern;
   forming a dopant supply layer containing a dopant element, on the liner layer; and
   forming a doped region in the active fin along an upper surface of the active fin by heat-treating the dopant supply layer.

2. The method of claim 1, wherein the forming of the liner layer comprises forming the liner layer along the upper surface of the active fin and both side surfaces of the active fin which face each other after the forming of the spacer.

3. The method of claim 1, wherein the forming of the doped region comprises forming the doped region in the active fin along the upper surface of the active fin and both side surfaces of the active fin which face each other, wherein the upper surface of the active fin lies in the same plane with a lower surface of the dummy gate pattern.

4. The method of claim 3, further comprising forming a source/drain region on the doped region.

5. The method of claim 1, further comprising forming a recess in the active fin on at least one side of the spacer before the forming of the liner layer, wherein the forming of the liner layer comprise forming the liner layer on a bottom surface of the recess and sidewalls of the recess which face each other.

6. The method of claim 5, wherein the forming of the doped region comprises forming the doped region in the active fin along the bottom surface of the recess and the sidewalls of the recess which face each other and further comprising forming a source/drain region on the doped region.

7. The method of claim 1, wherein the forming of the dopant supply layer comprises forming a dopant layer by knocking-in the dopant element and passivating the dopant layer.

8. The method of claim 1, wherein the forming of the doped region comprises forming a pre-doped region in the active fin by performing a first heat treatment process on the dopant supply layer at a first temperature and forming the doped region by performing a second heat treatment process on the dopant supply layer and the pre-doped region at a second temperature higher than the first temperature.

9. The method of claim 8, wherein the pre-doped region is formed by a diffusion of the dopant element into the active fin, and the doped region is formed to a uniform depth by a diffusion of the dopant element contained in the pre-doped region and the dopant element contained in the dopant supply layer into the active fin.

10. The method of claim 1, wherein the forming of the doped region comprises forming the doped region to extend along the upper surface of the active fin and contact an undoped region under the spacer.

11. The method of claim 10, wherein part of a lower surface of the spacer contacts an upper surface of the doped region.

12. The method of claim 1, further comprising sequentially removing the dopant supply layer and the liner layer after the forming of the doped region.

13. A method of fabricating a semiconductor device, the method comprising:
    forming an active fin which extending along a first direction;
    forming a field insulating layer exposing an upper part of the active fin, along long sides of the active fin;
    forming a dummy gate pattern extending along a second direction intersecting the first direction, on the active fin;
    forming a liner layer covering the active fin exposed by the dummy gate pattern;
    forming a dopant supply layer containing a dopant element, on the liner layer;
    forming a doped region in the active fin along an upper surface of the active fin and side surfaces of the active fin which face each other by heat-treating the dopant supply layer; and
    forming a source/drain region on the doped region.

14. The method of claim 13, wherein the forming of the liner layer comprises forming the liner layer along the upper surface of the active fin and the side surfaces of the active fin which face each other.

15. The method of claim 13, further comprising sequentially removing the dopant supply layer and the liner layer after the forming of the doped region.

16. The method of claim 13, wherein the forming of the doped region comprises forming a pre-doped region in the active fin by performing a first heat treatment process on the dopant supply layer at a first temperature and forming the doped region by performing a second heat treatment process on the dopant supply layer and the pre-doped region at a second temperature higher than the first temperature.

17. A method of fabricating a semiconductor device, the method comprising:
    forming an active fin extending along a first direction;
    forming a field insulating layer exposing an upper part of the active fin, along long sides of the active fin;

forming a dummy gate pattern extending along a second direction intersecting the first direction, on the active fin;

forming a spacer on at least one side of the dummy gate pattern;

forming a recess in the active fin exposed by the spacer and the dummy gate pattern;

forming a liner layer which covers the recess;

forming a dopant supply layer containing a dopant element, on the liner layer; and forming a doped region in the active fin along an upper surface of the recess to contact an undoped region under the spacer by heat-treating the dopant supply layer.

18. The method of claim 17, further comprising forming a source/drain region, which contacts the doped region, on the recess.

19. The method of claim 18, further comprising sequentially removing the dopant supply layer and the liner layer before the forming of the source/drain region.

* * * * *